United States Patent
Kim et al.

(10) Patent No.: US 12,016,178 B2
(45) Date of Patent: *Jun. 18, 2024

(54) SEMICONDUCTOR DEVICE

(71) Applicant: SAMSUNG ELECTRONICS CO., LTD., Suwon-si (KR)

(72) Inventors: Kyoung-Hee Kim, Hwaseong-si (KR); Woo Choel Noh, Hwaseong-si (KR); Ik Soo Kim, Yongin-si (KR); Jun Kwan Kim, Seoul (KR); Jinsub Kim, Seoul (KR); Yongjin Shin, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/097,592

(22) Filed: Jan. 17, 2023

(65) Prior Publication Data
US 2023/0180472 A1 Jun. 8, 2023

Related U.S. Application Data

(63) Continuation of application No. 17/099,994, filed on Nov. 17, 2020, now Pat. No. 11,563,017.

(30) Foreign Application Priority Data

May 28, 2020 (KR) .................. 10-2020-0064170

(51) Int. Cl.
*H10B 41/46* (2023.01)
*H10B 41/10* (2023.01)
(Continued)

(52) U.S. Cl.
CPC ............ *H10B 41/46* (2023.02); *H10B 41/10* (2023.02); *H10B 41/20* (2023.02); *H10B 43/10* (2023.02); *H10B 43/20* (2023.02); *H10B 43/40* (2023.02)

(58) Field of Classification Search
CPC ........ H10B 41/46; H10B 41/10; H10B 41/20; H10B 43/10; H10B 43/20; H10B 43/40;
(Continued)

(56) References Cited

U.S. PATENT DOCUMENTS 6,218,197 B1   4/2001   Kasai
7,408,213 B2   8/2008   Abe
(Continued)

FOREIGN PATENT DOCUMENTS

JP   2004 193176 A   7/2004
JP   3972128 B2      9/2007
(Continued)

OTHER PUBLICATIONS

Machine Translation of JP 2004 193176 A (2004).

*Primary Examiner* — Allison Bernstein
(74) *Attorney, Agent, or Firm* — Muir Patent Law, PLLC

(57) ABSTRACT

A semiconductor device including a substrate that includes a cell array region and a peripheral circuit region; a cell transistor on the cell array region of the substrate; a peripheral transistor on the peripheral circuit region of the substrate; a first interconnection layer connected to the cell transistor; a second interconnection layer connected to the peripheral transistor; an interlayer dielectric layer covering the first interconnection layer; and a blocking layer spaced apart from the first interconnection layer, the blocking layer covering a top surface and a sidewall of the second interconnection layer.

20 Claims, 17 Drawing Sheets

(51) Int. Cl.
*H10B 41/20* (2023.01)
*H10B 43/10* (2023.01)
*H10B 43/20* (2023.01)
*H10B 43/40* (2023.01)

(58) Field of Classification Search
CPC ........ H10B 12/50; H10B 63/30; H10B 12/30; H01L 23/3157; H01L 23/5386; H01L 21/02178; H01L 21/76834
See application file for complete search history.

(56) References Cited

U.S. PATENT DOCUMENTS

| | | |
|---|---|---|
| 7,579,640 B2 | 8/2009 | Kajita et al. |
| 7,598,557 B2 | 10/2009 | Nagai et al. |
| 9,666,590 B2 | 5/2017 | Chien et al. |
| 10,559,582 B2 | 2/2020 | Nishikawa et al. |
| 2009/0212397 A1 | 8/2009 | Tuttle |
| 2010/0163943 A1 | 7/2010 | Ozaki |

FOREIGN PATENT DOCUMENTS

| | | |
|---|---|---|
| KR | 10-1999-0048917 A | 7/1999 |
| KR | 10-2005-0098713 A | 10/2005 |
| KR | 10-2019-0058154 A | 5/2019 |

SEMICONDUCTOR DEVICE

CROSS-REFERENCE TO RELATED APPLICATIONS

This is a continuation application based on pending application Ser. No. 17/099,994, filed Nov. 17, 2020, the entire contents of which is hereby incorporated by reference.

Korean Patent Application No. 10-2020-0064170, filed on May 28, 2020, in the Korean Intellectual Property Office, and entitled: "Semiconductor Device and Method of Fabricating the Same," is incorporated by reference herein in its entirety.

BACKGROUND

1. Field

Embodiments relate to a semiconductor device and a method of fabricating the same.

2. Description of the Related Art

Semiconductor devices are beneficial in the electronic industry, e.g., because of their small size, multi-functionality, and/or low fabrication cost. Semiconductor devices have increasingly integrated with the development of electronic industry. Semiconductor devices may encompass semiconductor memory devices storing logic data, semiconductor logic devices processing operations of logic data, and hybrid semiconductor devices having both memory and logic elements. It has also been increasingly desired to improve characteristics for semiconductor devices.

SUMMARY

The embodiments may be realized by providing a semiconductor device including a substrate that includes a cell array region and a peripheral circuit region; a cell transistor on the cell array region of the substrate; a peripheral transistor on the peripheral circuit region of the substrate; a first interconnection layer connected to the cell transistor; a second interconnection layer connected to the peripheral transistor; an interlayer dielectric layer covering the first interconnection layer; and a blocking layer spaced apart from the first interconnection layer, the blocking layer covering a top surface and a sidewall of the second interconnection layer.

The embodiments may be realized by providing a semiconductor device including a substrate that includes a cell array region and a peripheral circuit region; a cell transistor on the cell array region of the substrate; a peripheral transistor on the peripheral circuit region of the substrate; a first lower interconnection layer connected to the cell transistor; a second lower interconnection layer connected to the peripheral transistor; an interface layer that covers the first lower interconnection layer and the second lower interconnection layer; a first upper interconnection layer connected to the first lower interconnection layer; a second upper interconnection layer connected to the second lower interconnection layer; an interlayer dielectric layer that covers the first upper interconnection layer; and a blocking layer between the second upper interconnection layer and the interlayer dielectric layer, the blocking layer covering the second upper interconnection layer, wherein a hydrogen permeability of the blocking layer is less than a hydrogen permeability of the interface layer.

The embodiments may be realized by providing a semiconductor device including a substrate that includes a cell array region and a peripheral circuit region; a plurality of cell transistors on the cell array region of the substrate; a plurality of capacitors connected to each of the cell transistors; a plurality of peripheral transistors on the peripheral circuit region of the substrate; a first lower interconnection layer connected to each of the capacitors; a second lower interconnection layer connected to each of the peripheral transistors; an interface layer that covers the first lower interconnection layer and the second lower interconnection layer; a first upper interconnection layer connected to the first lower interconnection layer; a second upper interconnection layer connected to the second lower interconnection layer; an interlayer dielectric layer that covers the first upper interconnection layer; a blocking layer spaced apart from the first upper interconnection layer, the blocking layer covering a top surface and a sidewall of the second upper interconnection layer; and a passivation layer on the interlayer dielectric layer, wherein the cell transistors include a plurality of first and second impurity regions on an upper portion of an active section defined by a device isolation layer; a plurality of bit-line contacts connected to corresponding first impurity regions; and a plurality of node contacts connected to corresponding second impurity regions, and each of the capacitors includes a bottom electrode, a top electrode, and a dielectric layer between the bottom electrode and the top electrode.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
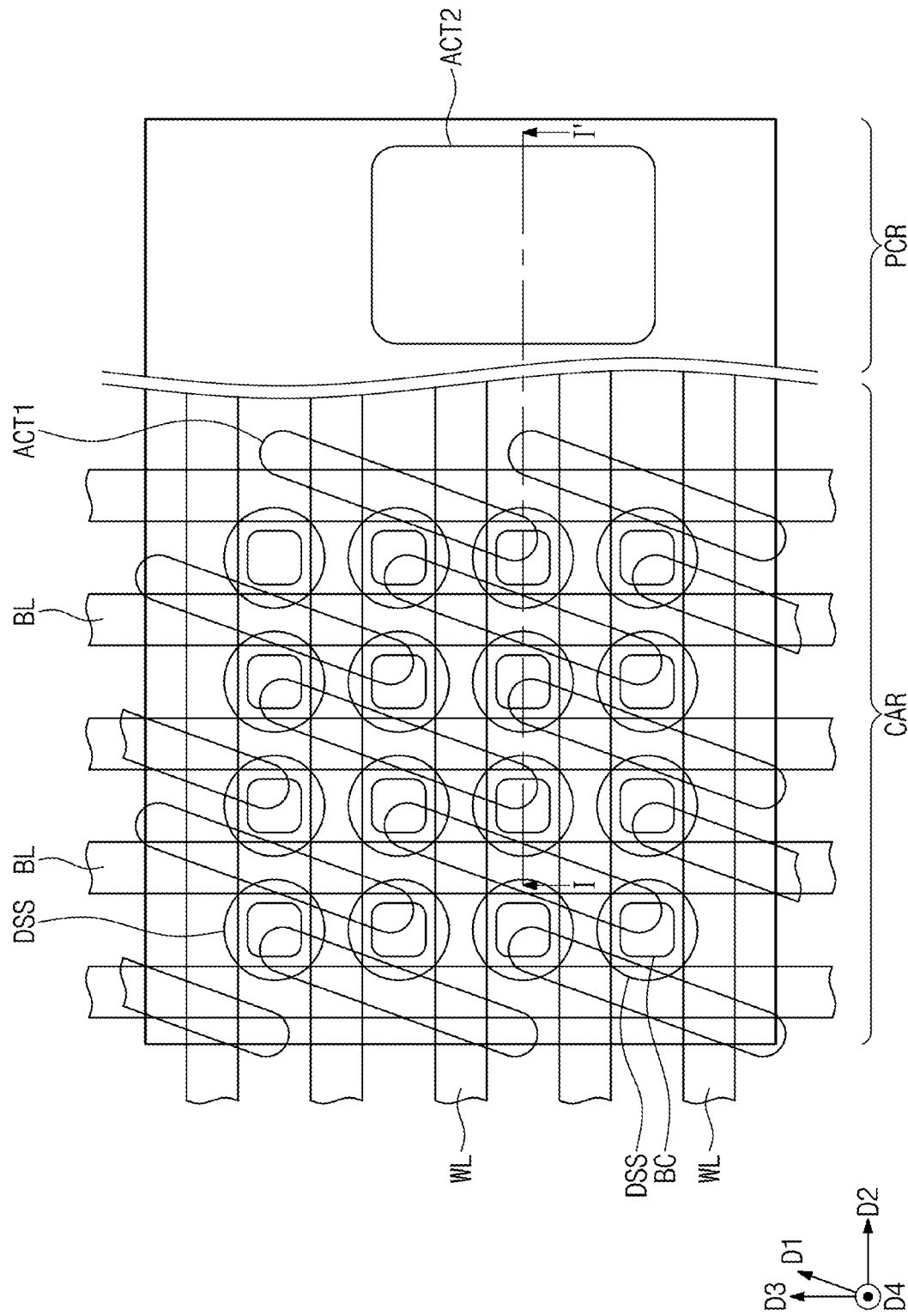
FIG. 1 illustrates a plan view of a semiconductor device according to some example embodiments.
Figure 2:
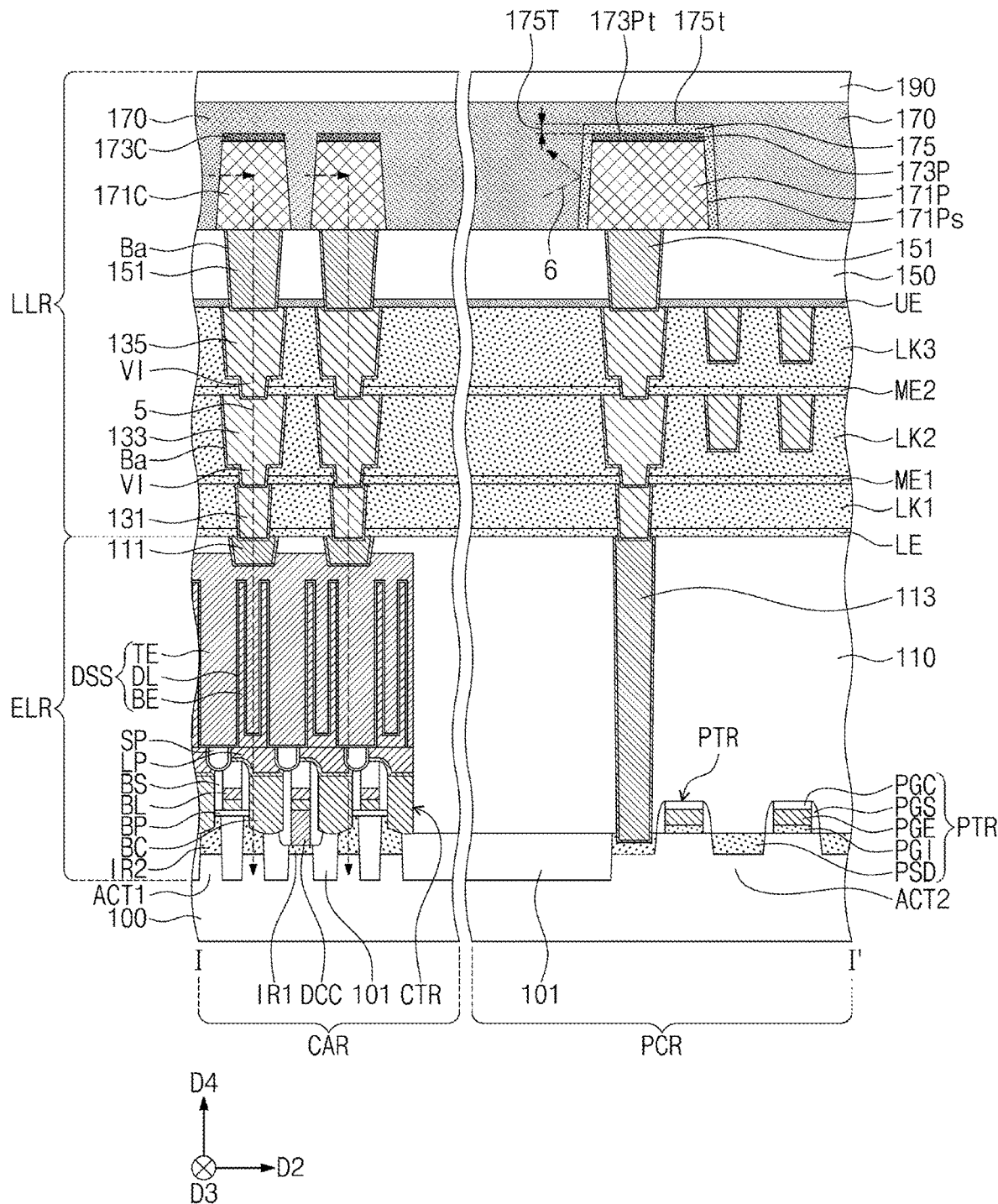
FIGS. 2 and 3 illustrate cross-sectional views taken along line I-I' of FIG. 1, showing a semiconductor device according to some example embodiments.

FIG. 1 illustrates a plan view showing a semiconductor device according to some example embodiments. FIG. 2 illustrates a cross-sectional view taken along line I-I' of FIG. 1, showing a semiconductor device according to some example embodiments.

Referring to FIGS. 1 and 2, a semiconductor device may include an integrated circuit region ELR on a substrate 100 and a wiring region LLR on the integrated circuit region ELR. The integrated circuit region ELR may be an area that includes a plurality of transistors or circuits on the substrate 100. The wiring region LLR may be an area that includes a plurality of interconnection layers connected to the plurality of transistors or circuits. As used herein, the term "or" is not an exclusive term, e.g., "A or B" would include A, B, or A and B.

When a memory device is adopted as the semiconductor device of an embodiment, the integrated circuit region ELR may include a cell array on a cell array region CAR and peripheral circuits on a peripheral circuit region PCR for driving the cell array. The cell array may include cell transistors CTR, and the peripheral circuits may include peripheral transistors PTR. In an implementation, the peripheral circuit region PCR may surround the cell array region CAR.

The cell array region CAR may include memory cells. The peripheral circuit region PCR may include a word line driver, a sense amplifier, row and column decoders, and control circuits. In an implementation, when a non-memory device is adopted as the semiconductor device according to an embodiment, the integrated circuit region ELR may include no cell array of the cell array region CAR. The following description will focus on a memory device.

On the cell array region CAR, the integrated circuit region ELR may include first active sections ACT1 defined by a device isolation layer 101 on the substrate 100, the cell transistors CTR on the first active sections ACT1, and data storage structures DSS connected to the cell transistors CTR.

The substrate 100 may be, e.g., a semiconductor substrate such as a silicon substrate, a germanium substrate, or a silicon-germanium substrate. The first active sections ACT1 on the substrate 100 have bar shapes horizontally separated from each other and may extend in a first direction D1 parallel to a top surface of the substrate 100. The first direction D1 may be a non-perpendicular direction to both of second and third directions D2 and D3 that are parallel to the top surface of the substrate 100. First impurity regions IR1 and second impurity regions IR2 may be provided on the first active sections ACT1. The first and second impurity regions IR1 and IR2 may have a different conductivity type from that of the substrate 100.

A pair of word lines WL may be on each of the first active sections ACT1. The word lines WL may be buried on the upper portion of the substrate 100, while extending (e.g., lengthwise) in the second direction D2 and running across the first active sections ACT1. The word lines WL may be spaced apart from each other in the third direction D3.

Buffer patterns BP may be on the top surface of the substrate 100. The buffer patterns BP may include a single-layered or a multi-layered dielectric material. Bit-line contacts DCC may be on the first active sections ACT1. The bit-line contacts DCC may penetrate the buffer patterns BP and may extend in a fourth direction D4 perpendicular to the top surface of the substrate 100. The bit-line contacts DCC may be connected to corresponding first impurity regions IR1.

Bit lines BL may intersect the word lines WL and may extend in the third direction D3. The bit lines BL may be spaced apart from each other in the second direction D2. The bit lines BL may run across a plurality of first active sections ACT1. The bit lines BL may be in contact with the buffer patterns BP and the bit-line contacts DCC. Each of the bit lines BL may include a first conductive pattern, a second conductive pattern, and a capping pattern that are sequentially stacked. Spacers BS may cover opposite sidewalls of each of the first conductive pattern, the second conductive pattern, and the capping pattern. Neighboring bit lines BL may include node contacts BC connected to the data storage structures DSS therebetween. The node contacts BC may be connected to corresponding second impurity regions IR2.

Landing pads LP may be on the node contacts BC. The landing pads LP may be separated from each other through a separation pattern SP. The data storage structure DSS may be on the landing pads LP. In an implementation, the data storage structure DSS may be a capacitor. The data storage structure DSS may include a bottom electrode BE, a top electrode TE, and a dielectric layer DL between the top and bottom electrodes TE and BE. In an implementation, the data storage structure DSS may further include support patterns that support a sidewall of the bottom electrode BE.

The bottom electrode BE of the data storage structure DSS may have, e.g., a pillar shape or a cylindrical shape whose bottom is closed. The bottom electrode BE may include, e.g., impurity-doped polysilicon, metal, metal nitride, metal silicide, or poly-silicide. The dielectric layer DL may conformally cover the bottom electrode BE. The dielectric layer DL may include, e.g., oxide, nitride, silicide, oxynitride, or silicide oxynitride each including hafnium (Hf), aluminum (Al), zirconium (Zr), or lanthanum (La). The top electrode TE may cover the dielectric layer DL. In an implementation, when the bottom electrode BE has a cylindrical shape whose bottom is closed, the top electrode TE may fill a cylindrically shaped inside of the bottom electrode BE. The top electrode TE may include, e.g., impurity-doped silicon-germanium.

The above-mentioned example discusses a structure of dynamic random memory (DRAM) including the integrated circuit region ELR on the cell array region CAR. In an implementation, the semiconductor device may be a memory device including a variable resistance substance such as a phase change material.

On the peripheral circuit region PCR, the integrated circuit region ELR may include a second active section ACT2 defined by the device isolation layer 101, and may also include the peripheral transistors PTR on the second active section ACT2. Each of the peripheral transistors PTR may include a peripheral gate dielectric layer PGI, a peripheral gate electrode PGE, and a peripheral gate capping layer PGC that are sequentially stacked on the second active section ACT2. Each of the peripheral transistors PTR may further include peripheral gate spacers PGS that cover opposite sidewalls of each of the peripheral gate dielectric layer PGI, the peripheral gate electrode PGE, and the peripheral gate capping layer PGC, and may also further include source/drain regions PSD on opposite sides of the peripheral gate electrode PGE.

A lower interlayer dielectric layer 110 may cover the peripheral transistors PTR on the peripheral circuit region PCR and also cover the data storage structures DSS on the cell array region CAR. In an implementation, the lower interlayer dielectric layer 110 may include, e.g., boro-phosphosilicate glass (BPSG), tonen silazene (TOSZ), undoped silicate glass (USG), spin-on glass (SOG), flowable oxide (FOX), tetraethyl orthosilicate (TEOS), high-density plasma chemical vapor deposition (HDP-CVD) dielectric, or hydrogen silsesquioxane (HSQ).

The wiring region LLR on the integrated circuit region ELR may include interlayer dielectric layers, low-k dielectric layers, and interconnection layers in the interlayer dielectric layers and the low-k dielectric layers. In an implementation, the wiring region LLR may include first, second, and third low-k dielectric layers LK1, LK2, and LK3 that are sequentially stacked, and may also include first and second upper interlayer dielectric layers 150 and 170 that are sequentially stacked on the third low-k dielectric layer LK3. First lower interconnection layers 131, second lower interconnection layers 133, and third lower interconnection layers 135 may be respectively in the first low-k dielectric layer LK1, the second low-k dielectric layer LK2, and the third low-k dielectric layer LK3. In an implementation, the number of the low-k dielectric layers and the number of the lower interconnection layers may be variously changed.

In this description, the language "low-k dielectric layer" may indicate a dielectric layer whose dielectric constant is less than about 4.4. In an implementation, the first, second, and third low-k dielectric layers LK1, LK2, and LK3 may include SiCOH. The first, second, and third lower interconnection layers 131, 133, and 135 may include, e.g., copper (Cu) or tungsten (W). Each of the second and third lower interconnection layers 133 and 135 may have, e.g., a linear structure that extends in one direction and has a via VI on its bottom surface. In an implementation, each of the first, second, and third lower interconnection layers 131, 133, and 135 may have a lower width and an upper width greater than the lower width. In this description, the term "width" may indicate a width in the second direction D2 (or the third direction D3) parallel to the top surface of the substrate 100.

The first, second, and third low-k dielectric layers LK1, LK2, and LK3 may have different thicknesses from each other. In an implementation, the first low-k dielectric layer LK1 may have a thickness that is less than that of the second low-k dielectric layer LK2 and less than that of the third low-k dielectric layer LK3. In this description, the term "thickness" may denote a thickness in the fourth direction D4 perpendicular to the top surface of the substrate 100. In an implementation, the first, second, and third low-k dielectric layers LK1, LK2, and LK3 may be formed of the same material. In an implementation, one or more of the first, second, and third low-k dielectric layers LK1, LK2, and LK3 may be formed of a material having different dielectric constant or composition from those of others of the first, second, and third low-k dielectric layers LK1, LK2, and LK3.

One of the first lower interconnection layers 131 on the cell array region CAR may be connected through a first lower contact 111 to an upper portion of the data storage structure DSS, e.g., to the top electrode TE of the capacitor. One of the first lower interconnection layers 131 on the peripheral circuit region PCR may be connected through a second lower contact 113 to one of the source/drain regions PSD of the peripheral transistors PTR. The second lower contact 113 may have a bottom surface at a lower level than that of a bottom surface of the first lower contact 111. The first and second lower contacts 111 and 113 may have top surfaces (e.g., surfaces facing away from the substrate 100 in the fourth direction D4) at substantially the same level. The first and second lower contacts 111 and 113 may include, e.g., tungsten (W), titanium (Ti), tantalum (Ta), or a nitride thereof.

A lower interface layer LE may be between the first low-k dielectric layer LK1 and the lower interlayer dielectric layer 110. An upper interface layer UE may be between the third low-k dielectric layer LK3 and a first upper interlayer dielectric layer 150 which will be discussed below. In an implementation, the lower interface layer LE may be in contact (e.g., direct contact) with a lowermost one of the first, second, and third low-k dielectric layers LK1, LK2, and LK3, and the upper interface layer UE may be in contact with an uppermost one of the first, second, and third low-k dielectric layers LK1, LK2, and LK3. First and second middle interface layers ME1 and ME2 may be between the first, second, and third low-k dielectric layers LK1, LK2, and LK3. In an implementation, the first middle interface layer ME1 may be between the first low-k dielectric layer LK1 and the second low-k dielectric layer LK2, and the second middle interface layer ME2 may be between the second low-k dielectric layer LK2 and the third low-k dielectric layer LK3. One or more of the lower interface layer LE, the upper interface layer UE, the first middle interface layer ME1, and the second middle interface layer ME2 may include a plurality of dielectric layers having different characteristics from each other. In an implementation, the upper interface layer UE may include a plurality of dielectric layers. In an implementation, the lower interface layer LE and the first and second middle interface layers ME1 and ME2 may each be a single layer. Each of the lower interface layer LE, the upper interface layer UE, the first middle interface layer ME1, and the second middle interface layer ME2 may include, e.g., silicon nitride (SiN) or silicon carbonitride (SiCN). In an implementation, the upper interface layer UE may include silicon nitride (SiN), and the lower interface layer LE and the first and second middle interface layers ME1 and ME2 may include silicon carbonitride (SiCN).

First and second upper interlayer dielectric layers 150 and 170 may be on the third low-k dielectric layer LK3. The first and second upper interlayer dielectric layers 150 and 170 may each have a dielectric constant greater than that of each of first, second, and third low-k dielectric layers LK1, LK2, and LK3. In an implementation, each of the first and second upper interlayer dielectric layers 150 and 170 may have a dielectric constant of about 4.4 or higher. The first and second upper interlayer dielectric layers 150 and 170 may include boro-phosphosilicate glass (BPSG), tonen silazene (TOSZ), undoped silicate glass (USG), spin-on glass (SOG), flowable oxide (FOX), tetraethyl orthosilicate (TEOS), high-density plasma chemical vapor deposition (HDP-CVD) dielectric, or hydrogen silsesquioxane (HSQ).

Upper contacts 151 may be in the first upper interlayer dielectric layer 150. The upper contacts 151 may penetrate the first upper interlayer dielectric layer 150 and the upper interface layer UE to contact the third lower interconnection layers 135. The upper contacts 151 may be electrically connected to the first, second, and third lower interconnection layers 131, 133, and 135, and also electrically connected to the first and second lower contacts 111 and 113. First and second upper interconnection layers 171C and 171P may be in the second upper interlayer dielectric layer 170. The first and second upper interconnection layers 171C and 171P may be in contact with top surfaces of the upper contacts 151 (e.g., may be electrically connected to the upper contacts 151). The first upper interconnection layer 171C may be in the second upper interlayer dielectric layer 170 on the cell array region CAR, and the second upper interconnection layer 171P may be in the second upper interlayer dielectric layer 170 on the peripheral circuit region PCR. The first and second upper interconnection layers 171C and 171P may each have a lower width and an upper width, and the upper width may be less than the lower width (e.g., may have a trapezoidal tapered shape).

A first antireflective layer 173C may be on the first upper interconnection layer 171C. A second antireflective layer 173P may be on the second upper interconnection layer 171P. The first and second antireflective layers 173C and 173P may include, e.g., titanium nitride (TN).

The upper contacts 151 may penetrate the first upper interlayer dielectric layer 150, and may connect the first upper interconnection layer 171C and the second upper interconnection layer 171P to the third lower interconnection layers 135. In an implementation, the upper contacts 151 may include, e.g., tungsten (W), titanium (Ti), tantalum (Ta), or a nitride thereof. The first and second upper interconnection layers 171C and 171P may include a different conductive material from that of the first, second, and third lower interconnection layers 131, 133, and 135. In an implementation, the first, second, and third lower interconnection layers 131, 133, and 135 may include a first metal, and the first and second upper interconnection layers 171C and 171P may include a second metal different from the first metal. In an implementation, the first and second upper interconnection layers 171C and 171P may include aluminum (Al).

The peripheral circuit region PCR may include a blocking layer 175 surrounding the second upper interconnection layer 171P and the second antireflective layer 173P. The blocking layer 175 may cover a sidewall 171Ps of the second upper interconnection layer 171P and a top surface 173Pt (e.g., surface facing away from the substrate 100 in the fourth direction D4) of the second antireflective layer 173P. The blocking layer 175 may be spaced apart from the first upper interconnection layer 171C. The blocking layer 175 may have a thickness 175T ranging, e.g., from about 50 Å to about 300 Å. In an implementation, the thickness 175T of the blocking layer 175 may range from, e.g., about 100 Å to about 200 Å. The thickness 175T of the blocking layer 175 may be measured in the fourth direction D4 from the top surface 173Pt of the second antireflective layer 173P. The thickness 175T of the blocking layer 175 may also be measured in the second direction D2 (or the third direction D3) from the sidewall 171Ps of the second upper interconnection layer 171P. The thickness 175T of the blocking layer 175 may be substantially uniform along the top surface 173Pt of the second antireflective layer 173P and the sidewall 171Ps of the second upper interconnection layer 171P. The thickness 175T of the blocking layer 175 may have a lower limit to help reduce or prevent introduction of hydrogen and an upper limit to save cost.

The blocking layer 175 may separate the second upper interconnection layer 171P from the second upper interlayer dielectric layer 170. The blocking layer 175 may include a different material from that of the second upper interlayer dielectric layer 170. The blocking layer 175 may include, e.g., aluminum oxide (AlOx). The blocking layer 175 may have a hydrogen permeability that is less than that of the upper interface layer UE. The hydrogen permeability of each of the blocking layer 175 and the upper interface layer UE will be further discussed in detail below with reference to the graphs shown in FIGS. 13, 14A, 14B, 15A, and 15B.

The second upper interlayer dielectric layer 170 may cover the first and second upper interconnection layers 171C and 171P, the first and second antireflective layers 173C and 173P, and the blocking layer 175. The second upper interlayer dielectric layer 170 may cover a top surface 175t of the blocking layer 175. The second upper interlayer dielectric layer 170 may be in contact with the first upper interlayer dielectric layer 150. The second upper interlayer dielectric layer 170 and the blocking layer 175 may have different hydrogen concentrations from each other. In an implementation, the second upper interlayer dielectric layer 170 may have a hydrogen concentration that is greater than that of the blocking layer 175.

A barrier layer Ba may be included in at least one selected from the first and second lower contacts 111 and 113, the first, second, and third lower interconnection layers 131, 133, and 135, one of the upper contacts 151, and the first and second upper interconnection layers 171C and 171P. The barrier layer Ba may be on a bottom surface and a sidewall of the at least one selected from the first and second lower contacts 111 and 113, the first, second, and third lower interconnection layers 131, 133, and 135, one of the upper contacts 151, and the first and second upper interconnection layers 171C and 171P. The barrier layer Ba may include conductive metal nitride, e.g., titanium nitride (TiN) or tantalum nitride (TaN).

A passivation layer 190 may be on the second upper interlayer dielectric layer 170. In an implementation, the passivation layer 190 may include the same material as that of the upper interface layer UE. The passivation layer 190 may include, e.g., silicon nitride (SiN). In an implementation, a density of silicon nitride (SiN) included in the passivation layer 190 may be less than a density of silicon nitride (SiN) included in the upper interface layer UE. The passivation layer 190 may have a hydrogen permeability that is greater than that of the upper interface layer UE and greater than that of the blocking layer 175. The hydrogen permeability of each of the passivation layer 190, the blocking layer 175, and the upper interface layer UE will be further discussed in detail below with reference to the following graphs shown in FIGS. 13, 14A, 14B, 15A, and 15B.

One or both of the first and second upper interlayer dielectric layers 150 and 170 may be a dielectric layer with high concentration of hydrogen and high capability of hydrogen supply. In an implementation, the second upper interlayer dielectric layer 170 may be a dielectric layer whose concentration of hydrogen and capability of hydrogen supply are relatively greater than those of the first upper interlayer dielectric layer 150. The first upper interlayer dielectric layer 150 may be a TEOS layer including tetraethyl orthosilicate (TEOS), and the second upper interlayer dielectric layer 170 may be an HDP layer including a high-density plasma chemical vapor deposition (HDP-CVD) dielectric material. In an implementation, the first and second upper interlayer dielectric layers 150 and 170 may all be an HDP layer. Dissimilarly, the second upper interlayer dielectric layer 170 may be a TEOS layer, and the first upper interlayer dielectric layer 150 may be an HDP layer. In this description, the language "hydrogen" may indicate hydrogen atoms or hydrogen molecules.

In an implementation, an annealing process may be performed such that the second upper interlayer dielectric layer 170 on the wiring region LLR supplies hydrogen to the cell array region CAR. In an implementation, the cell array region CAR may be supplied with hydrogen through a hydrogen supply path 5 that begins at the second upper interlayer dielectric layer 170 and passes through the first upper interconnection layer 171C, one of the upper contacts 151, the first, second, and third lower interconnection layers 131, 133, and 135, and the first lower contact 111. In an implementation, hydrogen may be supplied through a suitable path that passes through the first lower contact 111, the first, second, and third lower interconnection layers 131, 133, and 135, one of the upper contacts 151, and the first upper interconnection layer 171C.

The semiconductor device according to some example embodiments may be configured to allow unit memory cells to have reduced defects possibly occurring in fabrication processes, such as an oxidation process or a plasma etching process. In an implementation, the semiconductor device may be configured to supply dangling bonds with electrons from hydrogen supplied to the cell array region CAR, with the result that leakage current may be reduced, and that a reduction in data retention time of DRAM may be prevented or alleviated.

The semiconductor device according to some example embodiments may be configured to block a path along which hydrogen can be supplied to the peripheral circuit region PCR. On the peripheral circuit region PCR, a hydrogen flow path 6 may start from the second upper interlayer dielectric layer 170 but may not join with the second upper interconnection layer 171P, and the blocking layer 175 may cause the hydrogen flow path 6 to turn back to the second upper interlayer dielectric layer 170. In an implementation, the blocking layer 175 may prevent hydrogen from migrating from the second upper interlayer dielectric layer 170 toward the second upper interconnection layer 171P. As a result, on the peripheral circuit region PCR, the blocking layer 175 covering the second upper interconnection layer 171P may block or reduce the hydrogen supply from the second upper interlayer dielectric layer 170 toward the second upper interconnection layer 171P.

The semiconductor device according to some example embodiments may be configured such that the hydrogen supply path 5 is maintained to reach the cell array region CAR to thereby improve electrical characteristics, and that the blocking layer 175 blocks or suppresses the hydrogen supply to the peripheral circuit region PCR to thereby help prevent a reduction in reliability of the peripheral circuit region PCR. In an implementation, it may be possible to prevent the peripheral transistors PTR on the peripheral circuit region PCR from a reduction in reliability caused by acid that could be produced when hydrogen supplied to the peripheral circuit region PCR reacts with halogen elements (e.g., chlorine) present in the peripheral circuit region PCR. In an implementation, the semiconductor device may help prevent NBTI (negative-bias temperature instability) phenomena occurring at the peripheral transistors PTR.

Figure 3:
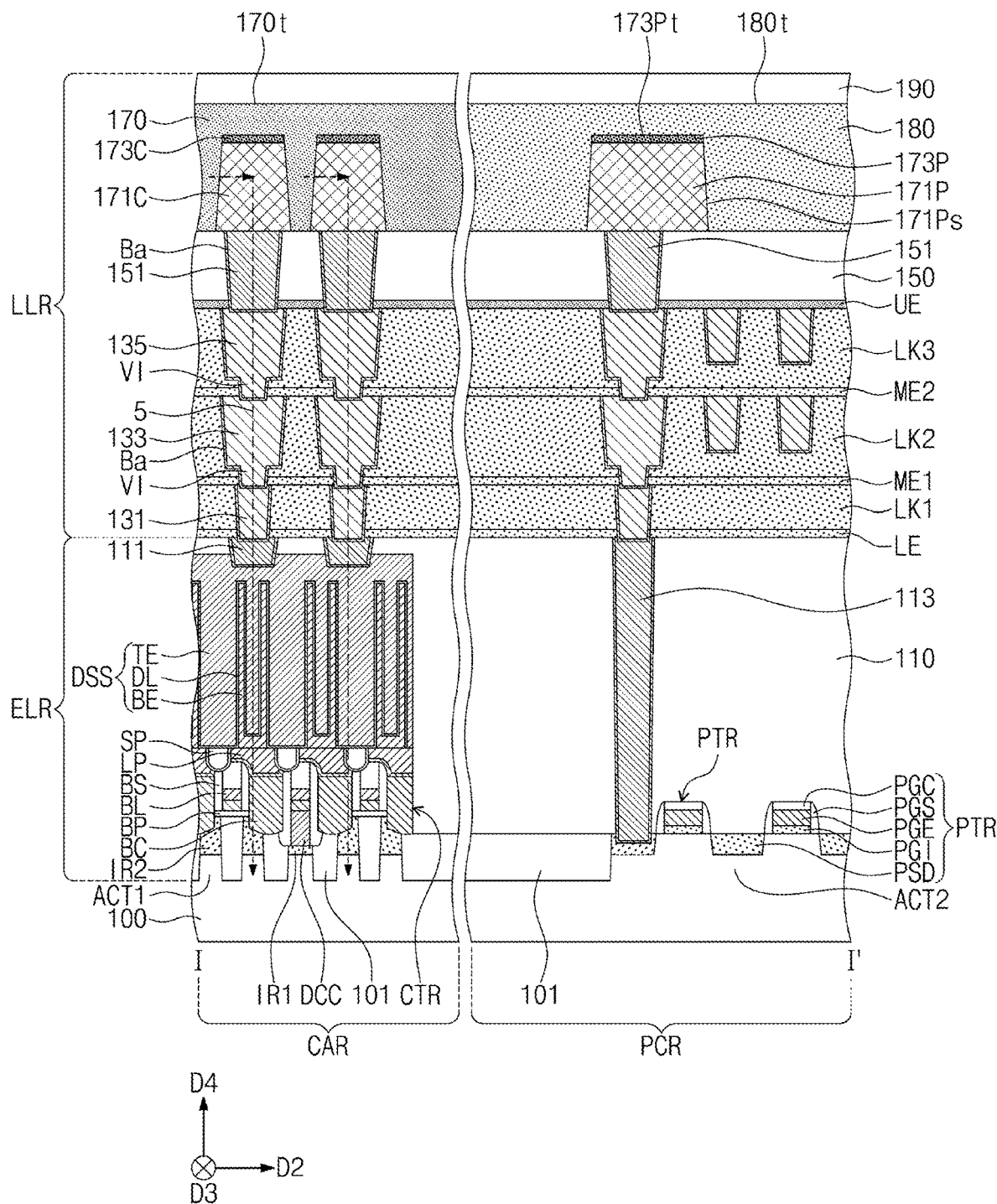

FIG. 3 illustrates a cross-sectional view taken along line I-I' of FIG. 1, showing a semiconductor device according to some example embodiments. For convenience of description, omissions may be made to avoid repetitive explanations of features substantially the same as those discussed with reference to FIG. 2.

Referring to FIGS. 1 and 3, on the cell array region CAR, the second upper interlayer dielectric layer 170 may be on the first upper interlayer dielectric layer 150, and on the peripheral circuit region PCR, a third upper interlayer dielectric layer 180 may be on the first upper interlayer dielectric layer 150. On the cell array region, the second upper interlayer dielectric layer 170 may cover the first upper interconnection layer 171C and the first antireflective layer 173C. On the peripheral circuit region PCR, the third upper interlayer dielectric layer 180 may cover the second upper interconnection layer 171P and the second antireflective layer 173P. The third upper interlayer dielectric layer 180 may be spaced apart from the first upper interconnection layer 171C. The second upper interlayer dielectric layer 170 may have a top surface 170t substantially coplanar with a top surface 180t of the third upper interlayer dielectric layer 180. The passivation layer 190 may be on the top surface 170t of the second upper interlayer dielectric layer 170 and the top surface 180t of the third upper interlayer dielectric layer 180.

The third upper interlayer dielectric layer 180 may include a different material from that of the second upper interlayer dielectric layer 170. The third upper interlayer dielectric layer 180 may include, e.g., silicon oxide ($SiO_2$). In an implementation, the third upper interlayer dielectric layer 180 may include the same material as that of the second upper interlayer dielectric layer 170, and may have a different hydrogen concentration from that of the second upper interlayer dielectric layer 170. The second upper interlayer dielectric layer 170 may have a hydrogen concentration greater than that of the third upper interlayer dielectric layer 180. In an implementation, the third upper interlayer dielectric layer 180 may include no hydrogen (e.g., may be essentially hydrogen free). The second upper interconnection layer 171P may be covered with the third upper interlayer dielectric layer 180 whose hydrogen concentration is less than that of the second upper interlayer dielectric layer 170, and it may be possible to block or reduce the hydrogen supply from the third upper interlayer dielectric layer 180 toward the second upper interlayer dielectric layer 170.

The semiconductor device according to some example embodiments may be configured such that the hydrogen supply path 5 is maintained to reach the cell array region CAR to thereby improve electrical characteristics, and that a hydrogen supply source (e.g., an HDP layer for supplying hydrogen) is removed from the peripheral circuit region PCR to thereby prevent a reduction in reliability.

FIGS. 4 to 10 illustrate cross-sectional views taken along line I-I' of FIG. 1, of stages in a method of fabricating a semiconductor device according to some example embodiments.

Figure 4:
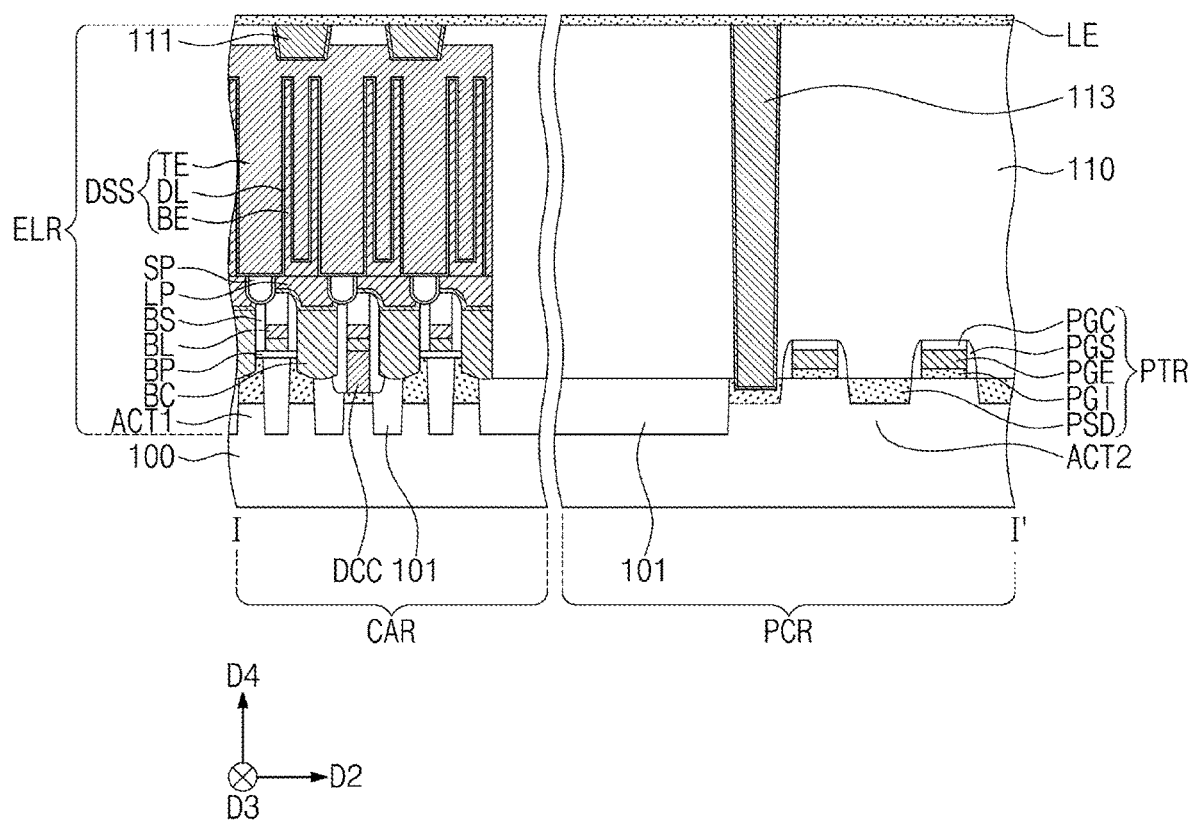
FIGS. 4 to 10 illustrate cross-sectional views taken along line I-I' of FIG. 1, of stages in a method of fabricating a semiconductor device according to some example embodiments.

Referring to FIGS. 1 and 4, an integrated circuit region ELR may be formed. The formation of the integrated circuit region ELR may include forming on an upper portion of a substrate 100 a device isolation layer 101 that defines first active sections ACT1 on a cell array region CAR, forming word lines WL, forming first impurity regions IR1 and second impurity regions IR2 on upper portions of the first active sections ACT1, forming bit-line contacts DCC connected to the first impurity regions IR1, forming bit lines BL, forming node contacts BC connected to the second impurity regions IR2, and forming data storage structures DSS on the node contacts BC. The formation of the data storage structures DSS may include sequentially forming bottom electrodes BE connected to the node contacts BC, dielectric layers DL, and a top electrode TE.

The formation of the integrated circuit region ELR may include forming, on the upper portion of the substrate 100, a device isolation layer 101 that defines a second active section ACT2 on a peripheral circuit region PCR, and forming a plurality of peripheral transistors PTR on the second active section ACT2.

A lower interlayer dielectric layer 110 may be formed to cover the data storage structures DSS on the cell array region CAR and also to cover the peripheral transistors PTR on the peripheral circuit region PCR. Contact holes may be formed to penetrate at least a portion of the lower interlayer dielectric layer 110, and then first and second lower contacts 111 and 113 may be formed in the contact holes. In an implementation, on the integrated circuit region ELR on the cell array region CAR, the contact hole may expose the top electrode TE of the data storage structures DSS, and as a result, the first lower contact 111 may be connected to the data storage structures DSS on the cell array region CAR. In addition, e.g., on the integrated circuit region ELR on the peripheral circuit region PCR, the contact hole may expose one of source/drain regions PSD of the peripheral transistors PTR, and as a result, the second lower contact 113 may be connected to the one of the source/drain regions PSD. The first and second lower contacts 111 and 113 may be formed by a deposition process such as sputtering or MOCVD and by a planarization process such as chemical mechanical polishing (CMP) after the deposition process.

The planarization process may expose a top surface of the lower interlayer dielectric layer 110. In an implementation, a surface treatment process may be performed on the lower interlayer dielectric layer 110 exposed by the planarization process. In an implementation, the surface treatment process may include, e.g., a UV treatment, a direct (or remote) plasma treatment, or a gas treatment using $NH_3$, $H_2$, Ar, $N_2$, or $SiH_4$. After the surface treatment process, a lower interface layer LE may be formed on the lower interlayer dielectric layer 110.

Figure 5:
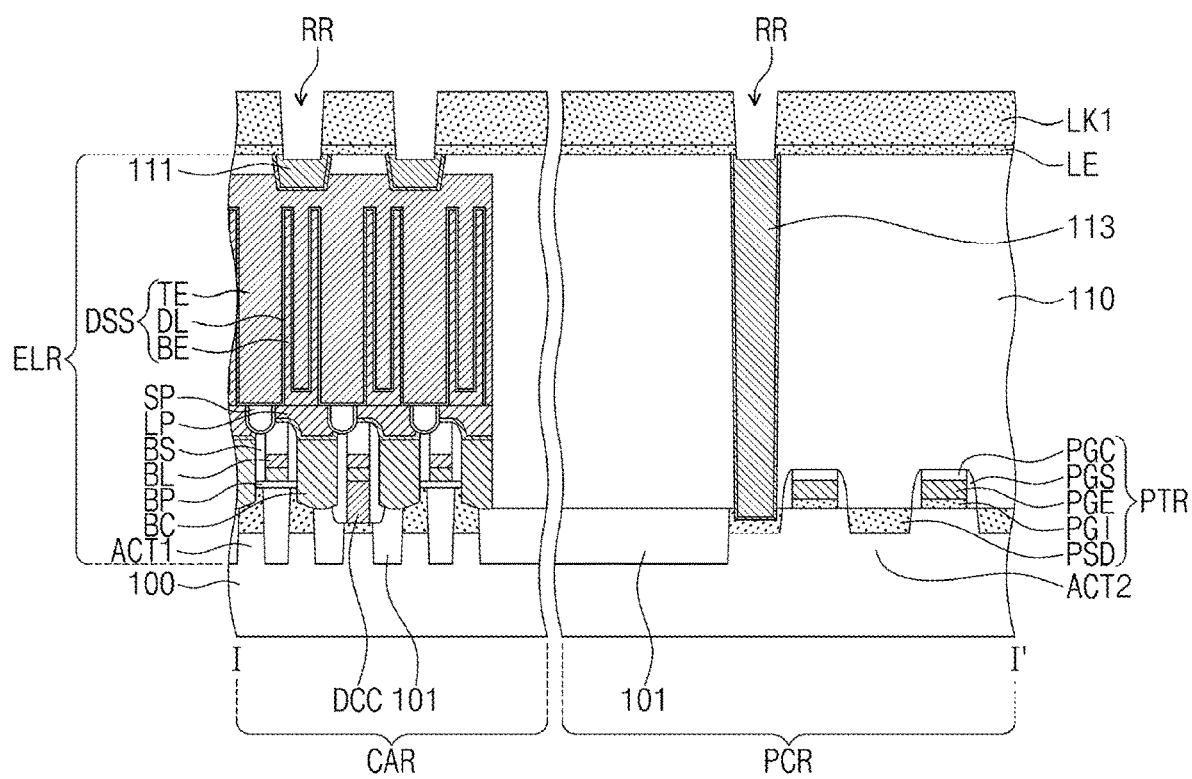

Referring to FIG. 5, a first low-k dielectric layer LK1 may be formed on the lower interface layer LE. In an implementation, the first low-k dielectric layer LK1 may be formed of SiCOH. A mask pattern may be formed on the first low-k dielectric layer LK1, and then an etching process may be performed to expose the first and second lower contacts 111 and 113. In an implementation, the etching process may partially etch the first and second lower contacts 111 and 113. The lower interface layer LE may serve as an etch stop layer in the etching process. Recessions or recesses RR may be formed on the first low-k dielectric layer LK1. The recesses RR may be regions defined by top surfaces of the first and second lower contacts 111 and 113, a sidewall of the lower interface layer LE, and a sidewall of the first low-k dielectric layer LK1. The etching process may include a dry etching process and/or a wet etching process.

Figure 6:
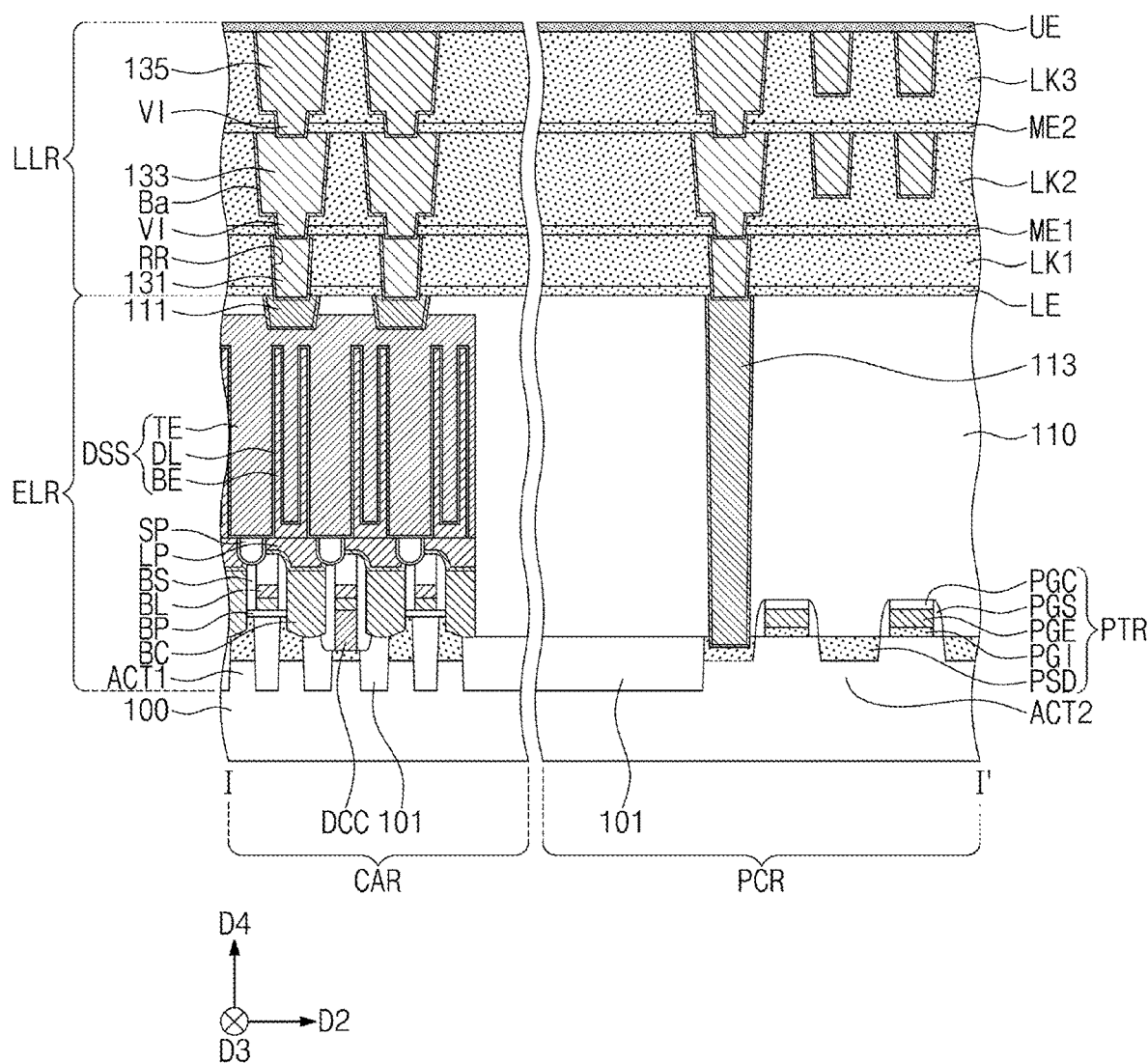

Referring to FIG. 6, first lower interconnection layers 131 may be formed to fill the recesses RR. In an implementation, the first lower interconnection layers 131 may be formed by a damascene process using copper (Cu) or tungsten (W). Afterwards, the damascene process may be repeatedly performed to form second and third lower interconnection layers 133 and 135. One or more of the first, second, and third lower interconnection layers 131, 133, and 135 may be formed by a dual damascene process. As a result of the damascene process, each of the first, second, and third lower interconnection layers 131, 133, and 135 may have a lower width and an upper width greater than the lower width.

An upper interface layer UE may be formed to cover the third lower interconnection layers 135. The upper interface layer UE and its underlying first and second middle interface layers ME1 and ME2 may be formed by processes that correspond to that used for forming the lower interface layer LE discussed above. Through the processes mentioned above, a wiring region LLR may be partially formed on the integrated circuit region ELR.

Figure 7:
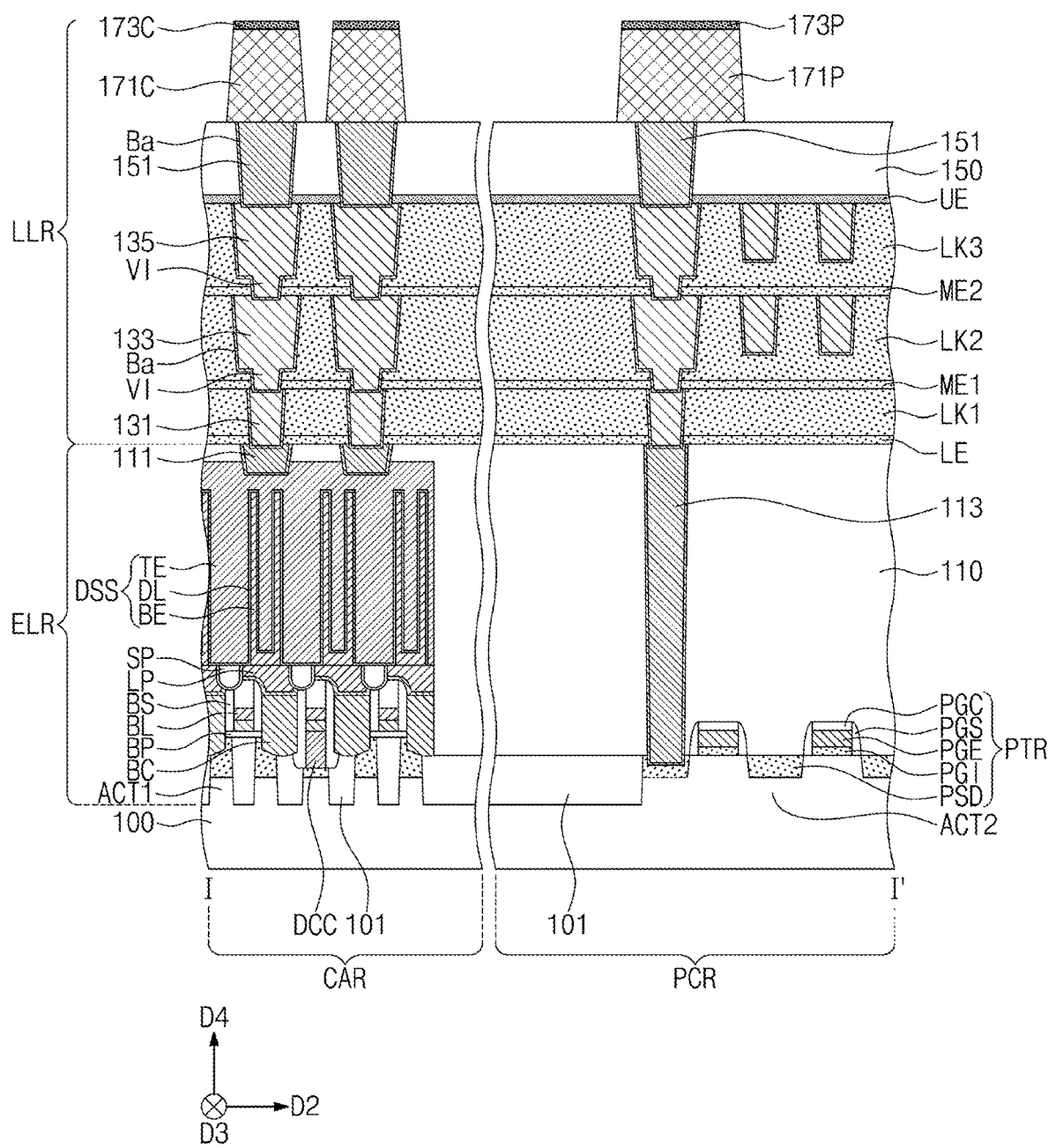

Referring to FIG. 7, a first upper interlayer dielectric layer 150 may be formed on the upper interface layer UE. A mask pattern may be formed on the first upper interlayer dielectric layer 150, and then an etching process may be performed to expose the third lower interconnection layers 135. In an implementation, the etching process may partially etch the third lower interconnection layers 135. After the etching process, a deposition process and a planarization process may be performed to form upper contacts 151. The upper contacts 151 may penetrate the upper interface layer UE to contact the third lower interconnection layers 135. The upper contacts 151 may be formed by a method that corresponds to that used for forming the first and second lower contacts 111 and 113.

First and second upper interconnection layers 171C and 171P and first and second antireflective layers 173C and 173P may be formed on the first upper interlayer dielectric layer 150 and the upper contacts 151. In an implementation, the first upper interconnection layer 171C may be formed on the cell array region CAR and may be electrically connected to the data storage structure DSS on the cell array region CAR. The second upper interconnection layer 171P may be formed on the peripheral circuit region PCR and may be electrically connected to one of the peripheral transistors PTR on the peripheral circuit region PCR. The first and second upper interconnection layers 171C and 171P may be formed by forming a conductive layer of aluminum (Al) and then patterning the conductive layer. In an implementation, a reactive ion etching (RIE) process may be performed to pattern the conductive layer. The first antireflective layer 173C may be formed on a top surface of the first upper interconnection layer 171C, and the second antireflective layer 173P may be formed on a top surface of the second upper interconnection layer 171P.

Figure 8:
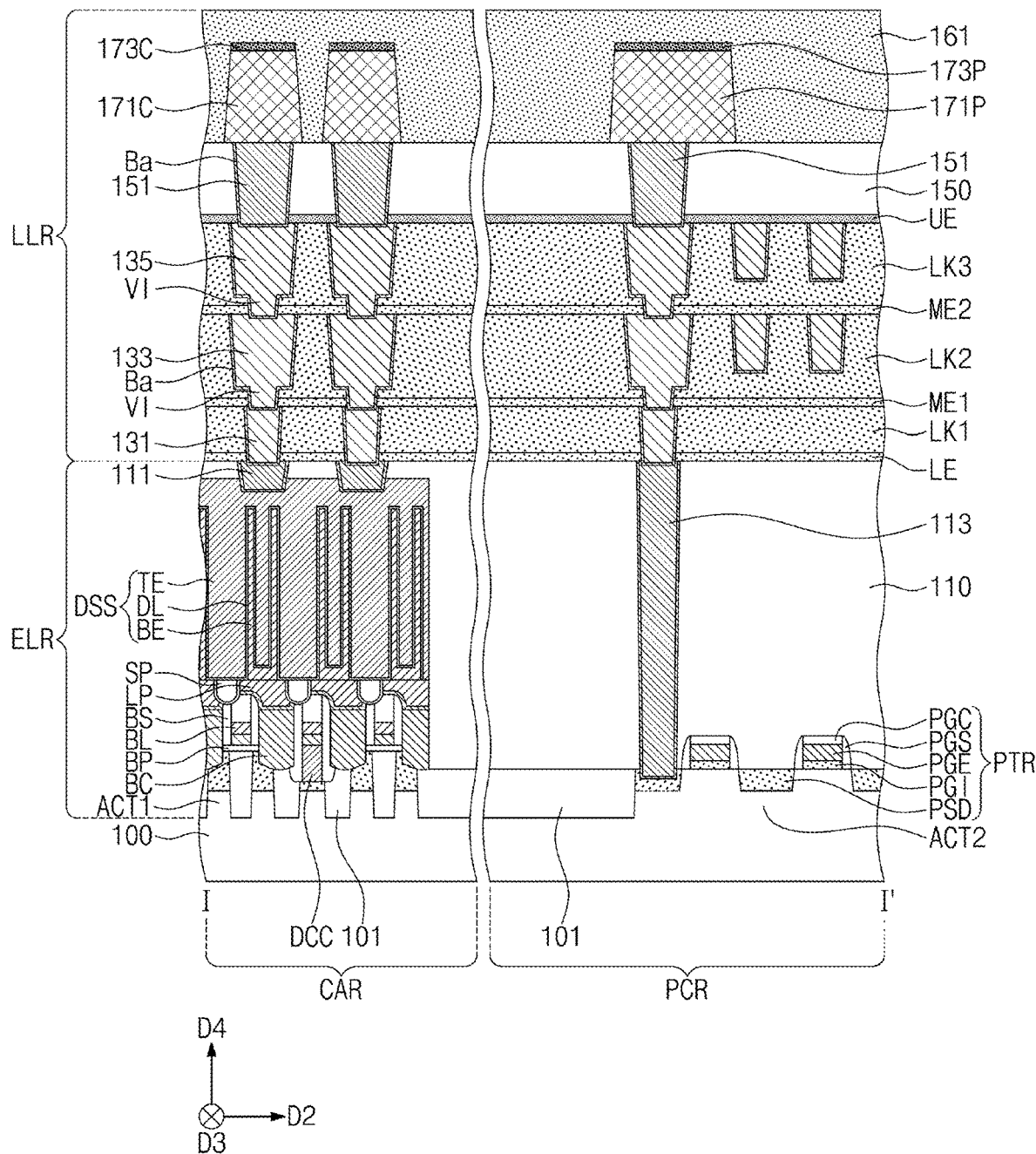

Referring to FIG. 8, a first mask layer 161 may be formed to cover the first and second upper interconnection layers 171C and 171P and a top surface of the first upper interlayer dielectric layer 150. The first mask layer 161 may be formed by a spin coating process. In an implementation, the first mask layer 161 may include a carbon-based or silicon-based spin-on-hardmask (SOH) material, or a hardmask material including silicon oxide or silicon nitride.

Figure 9:
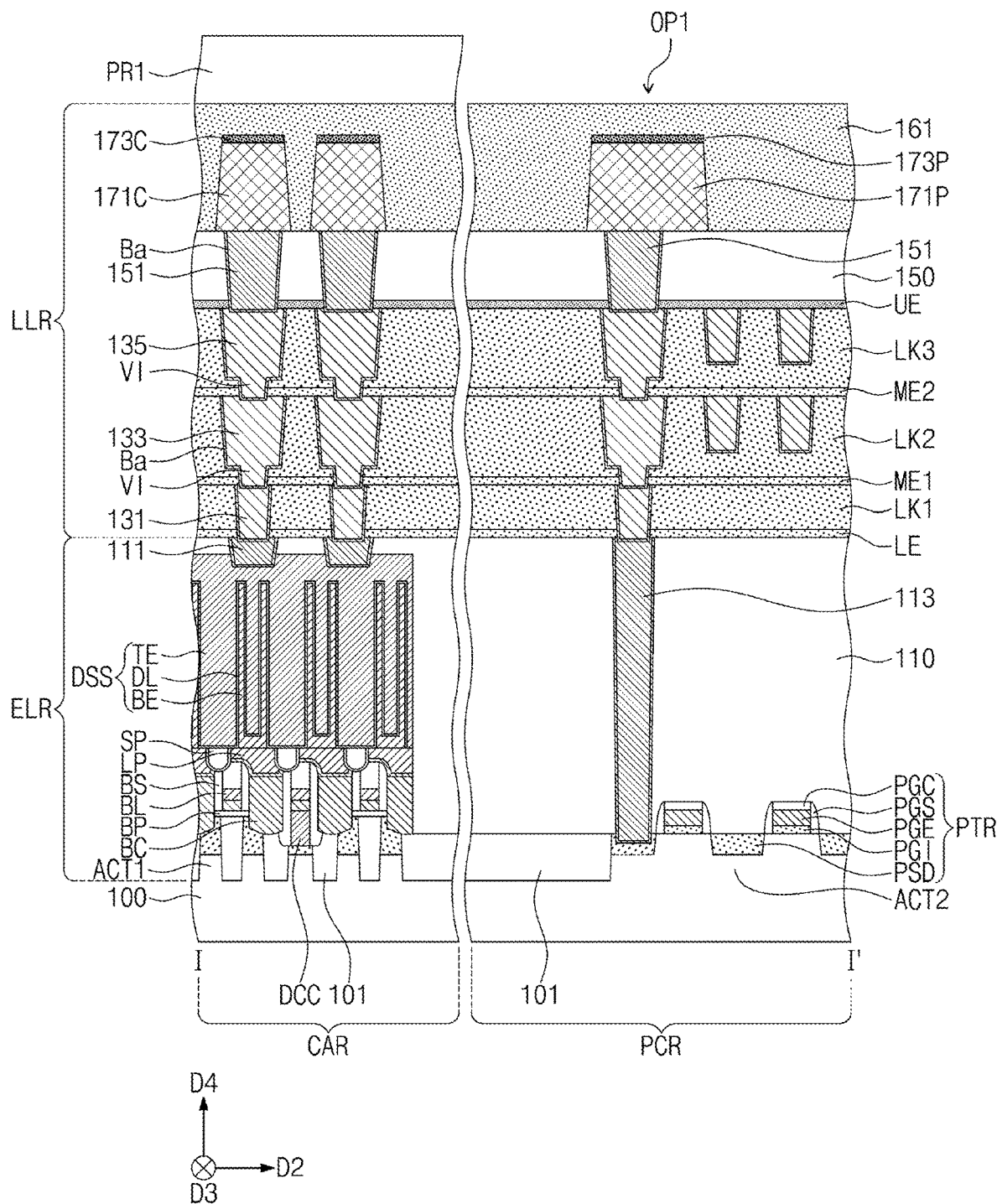

Referring to FIG. 9, a first photoresist pattern PR1 may be formed on the first mask layer 161. The first photoresist pattern PR1 may overlap the cell array region CAR, and may not be formed on the peripheral circuit region PCR. The first photoresist pattern PR1 may define a first opening OP1. The first opening OP1 may externally expose the first mask layer 161 on the peripheral circuit region PCR.

Figure 10:
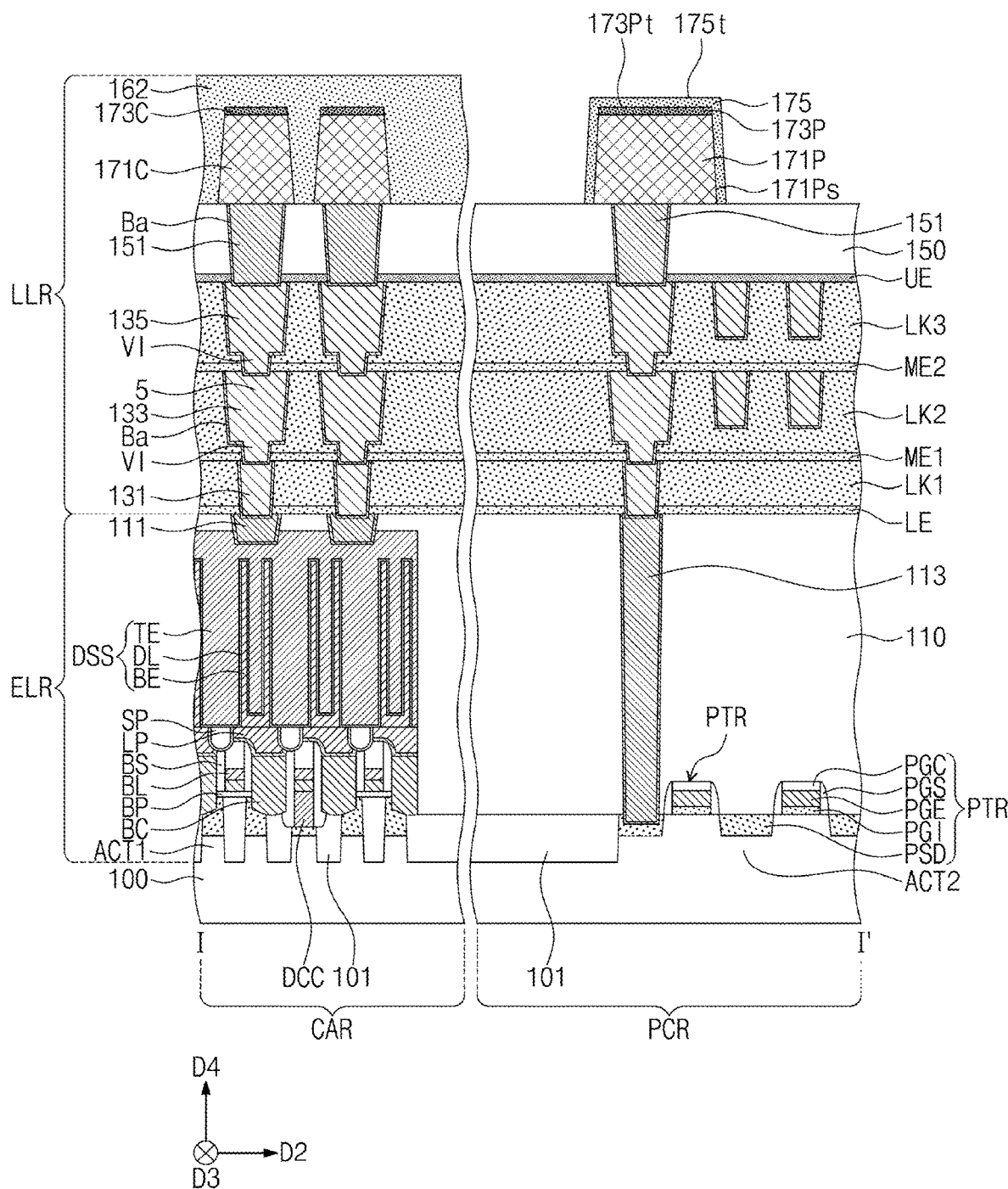

Referring to FIGS. 9 and 10, the first mask layer 161 exposed to the first opening OP1 may be selectively etched to form a first mask pattern 162. The first mask pattern 162 may expose the second upper interconnection layer 171P and a portion of the top surface of the first upper interlayer dielectric layer 150 on the peripheral circuit region PCR. After the etching process, the first photoresist pattern PR1 may be removed.

After the first photoresist pattern PR1 is removed, a selective deposition process may be performed to form a blocking layer 175 that covers the second upper interconnection layer 171P and the second antireflective layer 173P. The selective deposition process may include, e.g., physical vapor deposition (PVD), chemical vapor deposition (CVD), or electroless deposition (ELD). In an implementation, the blocking layer 175 may be selectively formed on a sidewall 171Ps of the second upper interconnection layer 171P and a top surface 173Pt of the second antireflective layer 173P. Even after the blocking layer 175 is formed, the top surface of the first upper interlayer dielectric layer 150 may still be externally exposed on the peripheral circuit region PCR. After the blocking layer 175 is formed, the first mask pattern 162 may be removed.

Referring back to FIG. 2, a second upper interlayer dielectric layer 170 may be formed to cover the first upper interlayer dielectric layer 150, the first and second upper interconnection layers 171C and 171P, the first and second antireflective layers 173C and 173P, and the blocking layer 175. The second upper interlayer dielectric layer 170 may directly cover a portion of the top surface of the first upper interlayer dielectric layer 150 on the peripheral circuit region PCR. A passivation layer 190 may be formed on the second upper interlayer dielectric layer 170. The second upper interlayer dielectric layer 170 and the passivation layer 190 may be formed on the cell array region CAR and the peripheral circuit region PCR.

Afterwards, an annealing process may be performed. In an implementation, the annealing process may be performed at about 300° C. to about 500° C. for about several tens to hundreds of minutes. Heat generated from the annealing process may be provided to the passivation layer 190 and then transmitted through a hydrogen supply path 5. During the annealing process, the passivation layer 190 may help prevent hydrogen from deviating, e.g., in a direction opposite to that in which hydrogen flows along the hydrogen supply path 5.

The annealing process may allow the cell array region CAR to receive hydrogen from the second upper interlayer dielectric layer 170 through the first upper interconnection layer 171C, one of the upper contacts 151, the first, second, and third lower interconnection layers 131, 133, and 135, and the first lower contact 111. In an implementation, hydrogen contained in the second upper interlayer dielectric layer 170 may migrate along the hydrogen supply path 5, and then may be transmitted to the first active sections ACT1 on the substrate 100. In an implementation, even during the annealing process, the blocking layer 175 may prevent hydrogen from being supplied from the second upper interlayer dielectric layer 170 to the peripheral circuit region PCR.

Figure 11:
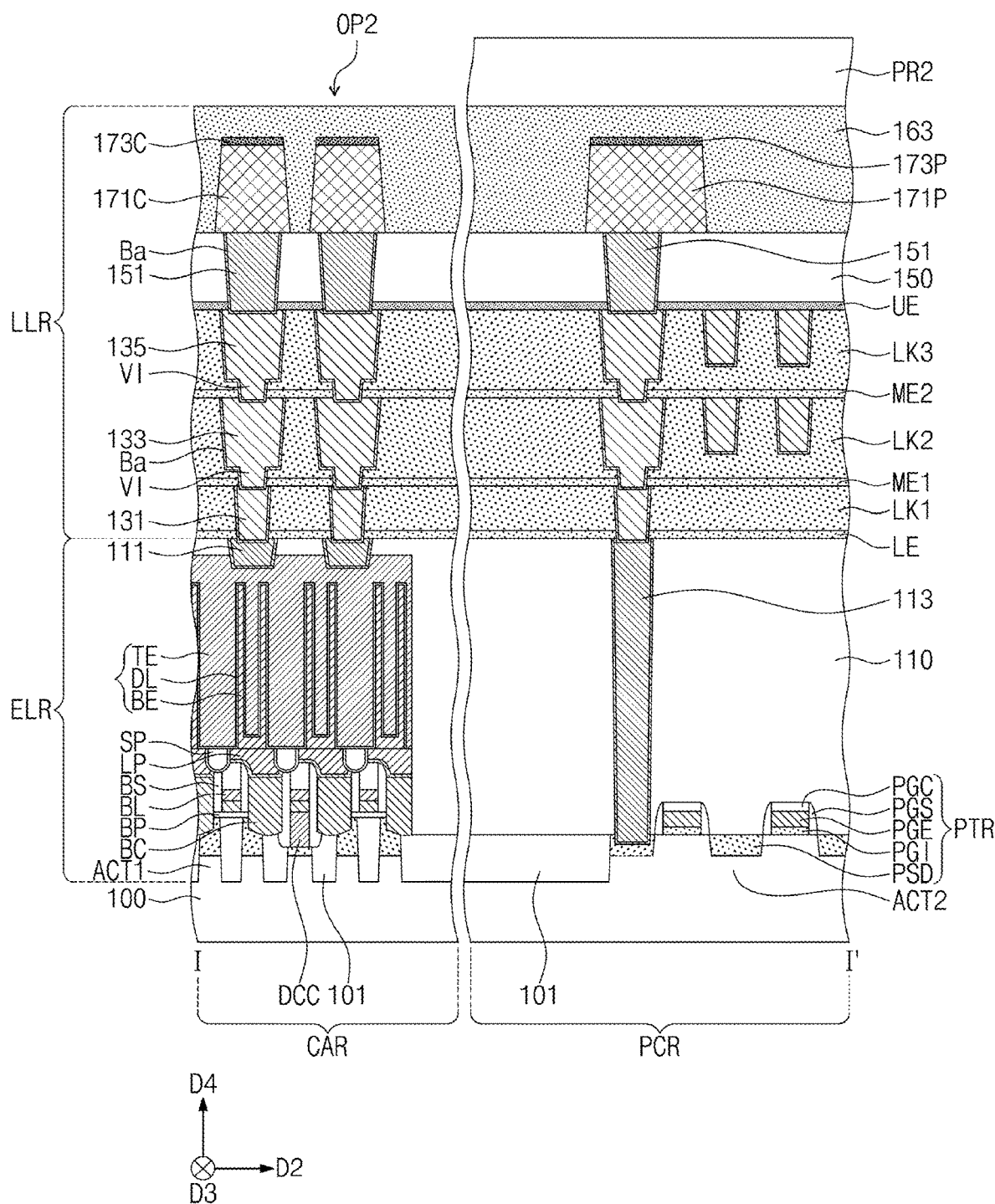
FIGS. 11 and 12 illustrate cross-sectional views taken along line I-I' of FIG. 1, of stages in a method of fabricating a semiconductor device according to some example embodiments.
Figure 12:
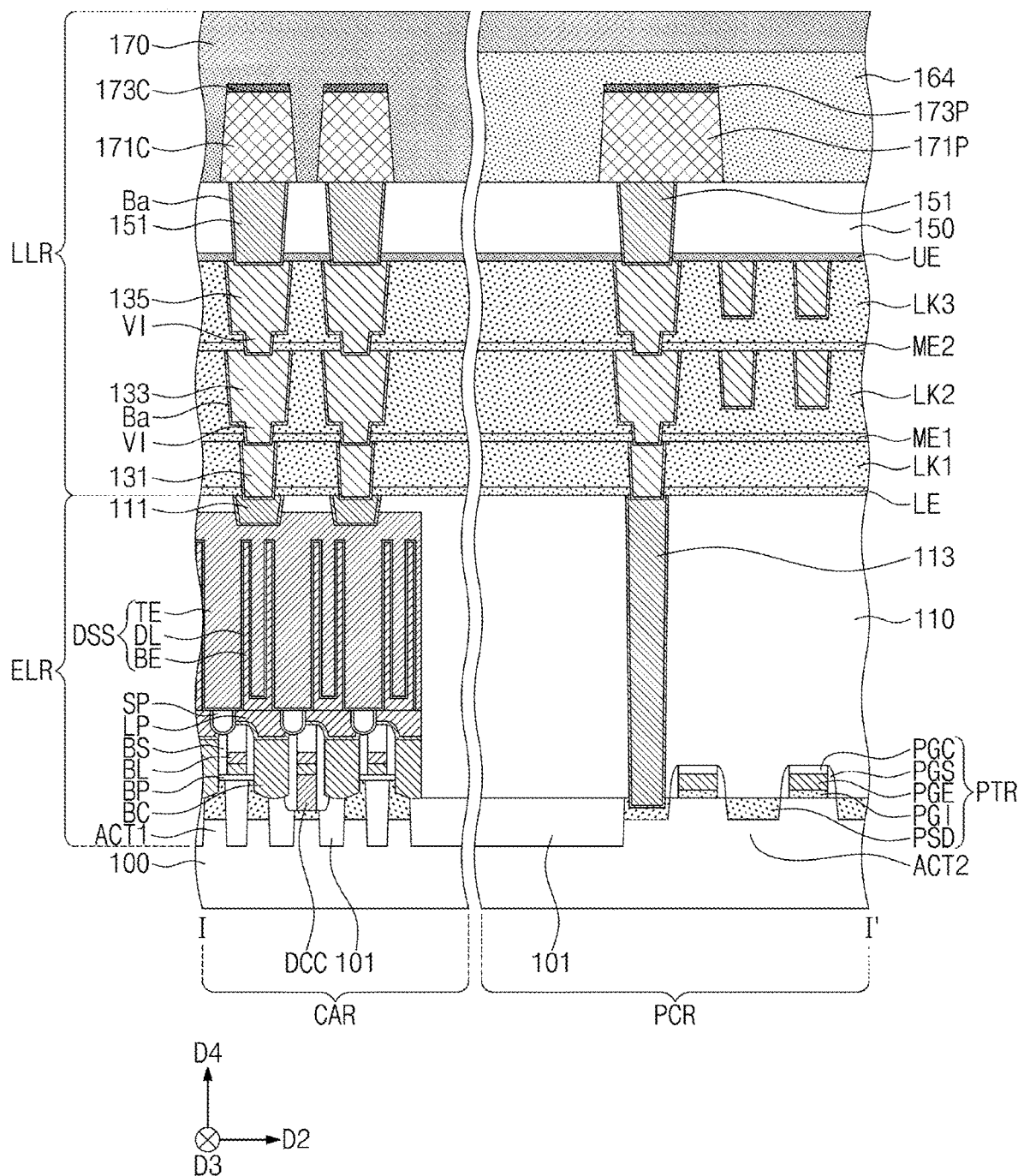

FIGS. 11 and 12 illustrate cross-sectional views taken along line I-I' of FIG. 1, of stages in a method of fabricating a semiconductor device according to some example embodiments. According to some example embodiments, the following described method may include the procedures discussed with reference to FIGS. 4 to 7, and a repetitive description may be omitted.

Referring to FIG. 11, a second mask layer 163 may be formed to cover the first and second upper interconnection layers 171C and 171P and the top surface of the first upper interlayer dielectric layer 150. The second mask layer 163 may be formed by a spin coating process. In an implementation, the second mask layer 163 may include a carbon or silicon spin-on-hardmask (SOH) material, or a hardmask material including silicon oxide or silicon nitride.

A second photoresist pattern PR2 may be formed on the second mask layer 163. The second photoresist pattern PR2 may overlap the peripheral circuit region PCR, and may not be formed on the cell array region CAR. The second photoresist pattern PR2 may define a second opening OP2. The second opening OP2 may externally expose the second mask layer 163 on the cell array region CAR.

Referring to FIGS. 11 and 12, portions the second mask layer 163 exposed to the second opening OP2 may be selectively etched, and remaining portion may form a second mask pattern 164. The second mask pattern 164 may expose the first upper interconnection layer 171C and a portion of the top surface of the first upper interlayer dielectric layer 150 on the cell array region CAR. After the etching process, the second photoresist pattern PR2 may be removed. After the second photoresist pattern PR2 is removed, a second upper interlayer dielectric layer 170 may be formed. The second upper interlayer dielectric layer 170 may cover the first upper interconnection layer 171C and a portion of the top surface of the first upper interlayer dielectric layer 150 on the cell array region CAR, and may also cover the second mask pattern 164 on the peripheral circuit region PCR. At this step, the second upper interlayer dielectric layer 170 may have a top surface at a higher level than that of a top surface of the second mask pattern 164.

Referring back to FIG. 3, the second upper interlayer dielectric layer 170 may be partially removed by a planarization process such as chemical mechanical polishing (CMP). The planarization process may continue until the top surface of the second mask pattern 164 of FIG. 12 is exposed. After the planarization process, the second mask pattern 164 may be called a third upper interlayer dielectric layer 180. Thereafter, a passivation layer 190 may be formed on the second and third upper interlayer dielectric layers 170 and 180.

After that, the annealing process discussed with reference to FIG. 2 may be performed. The annealing process may supply the cell array region CAR with hydrogen contained in the second upper interlayer dielectric layer 170. Even during the annealing process, the third upper interlayer dielectric layer 180 with low content of hydrogen may not supply hydrogen to the peripheral circuit region PCR.

Thermal desorption spectroscopy (TDS) may be employed to measure hydrogen contents and hydrogen permeability shown in FIGS. 13, 14A, 14B, 15A, and 15B. The thermal desorption spectroscopy is a method of observing desorbed molecules from a surface of a sample when the surface temperature is increased over time. In the graphs, the horizontal axis indicates time, whose unit is a minute. In the graphs, the left vertical axis denotes a relative amount of detected desorbed molecules (e.g. hydrogen). Additionally, in the graphs, the right vertical axis expresses temperature, whose unit is Celsius (° C.). For example, the measurement may be fulfilled in such a way that a temperature is increased for about 27 minutes and maintained for about 10 minutes.

Figure 13:
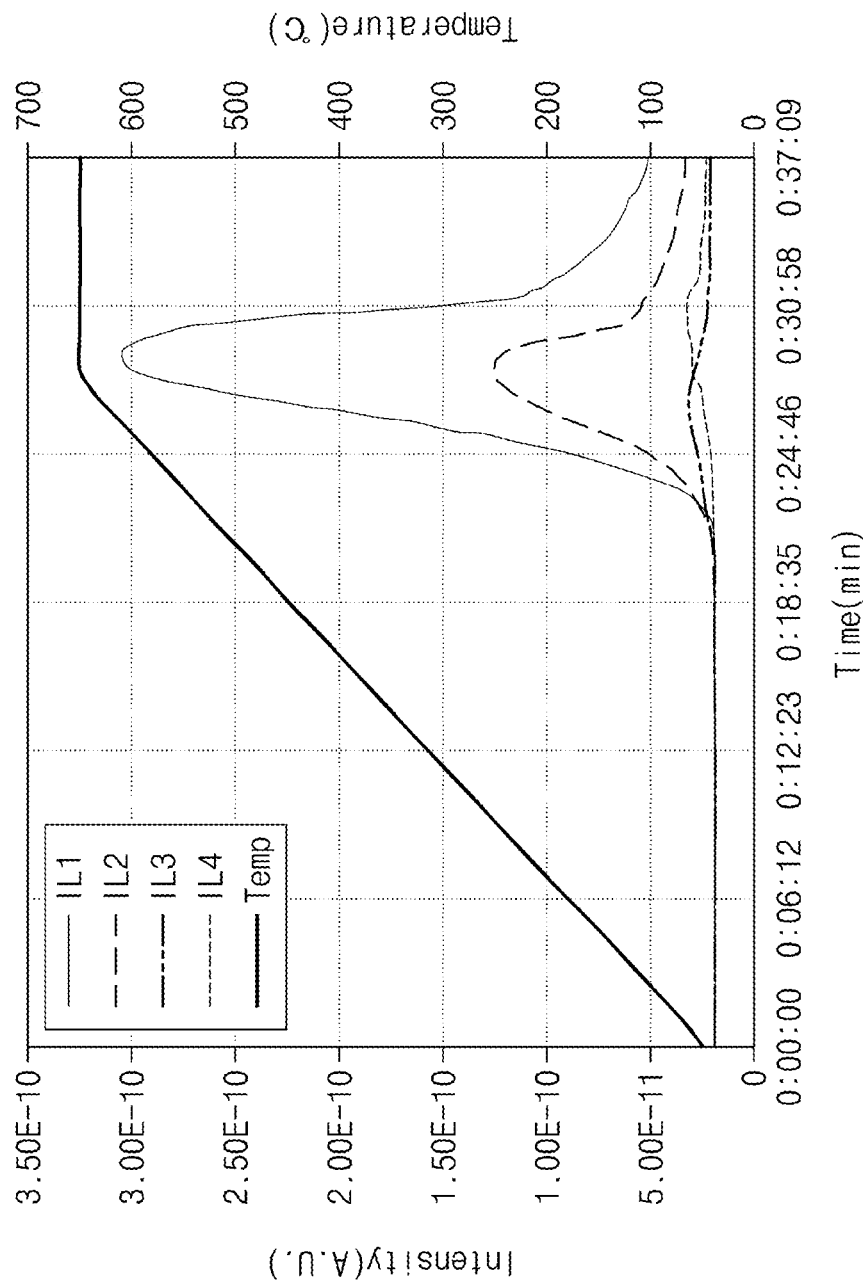
FIG. 13 illustrates a graph showing hydrogen content of blocking layers including different materials from each other in a semiconductor device according to some example embodiments.

FIG. 13 illustrates a graph showing hydrogen content in blocking layers including different materials from each other in a semiconductor device according to some example embodiments.

Referring to FIG. 13, a method of measuring hydrogen contents may include forming, on a silicon substrate, one of first to fourth dielectric layers IL1 to IL4 that has a thickness of about 200 Å, and detecting hydrogen desorbed from the one of the first to fourth dielectric layers IL1 to IL4 while increasing a temperature.

The first and second dielectric layers IL1 and IL2 may include silicon nitride (SiN). The third and fourth dielectric layers IL3 and IL4 may include aluminum oxide (AlOx). A density of silicon nitride contained in the first dielectric layer IL1 may be less than that of silicon nitride contained in the second dielectric layer IL2. The third dielectric layer IL3 may be deposited by a physical vapor deposition (PVD) process, and the fourth dielectric layer IL4 may be deposited by a chemical vapor deposition (CVD) process.

Referring to FIG. 2, the passivation layer 190 may include silicon nitride whose density is substantially the same as that of silicon nitride included in the first dielectric layer IL1, and the upper interface layer UE may include silicon nitride whose density is substantially the same as that of silicon nitride included in the second dielectric layer IL2. The blocking layer 175 may include a material substantially the same as that of the third dielectric layer IL3 or the fourth dielectric layer IL4.

As the temperature is increased, hydrogen may be detected from the first to fourth dielectric layers IL1 to IL4 at about 500° C. or higher. An amount of hydrogen detected from the second dielectric layer IL2 may be less than that detected from the first dielectric layer IL1. An amount of hydrogen detected from the third dielectric layer IL3 or the fourth dielectric layer IL4 may be less than that detected from the first dielectric layer IL1 and that detected from the second dielectric layer IL2.

When the first to fourth dielectric layers IL1 to IL4 are compared with each other in terms of an amount of detected hydrogen, it may be seen that the third and fourth dielectric layers IL3 and IL4 have hydrogen contents less than those of the first and second dielectric layers IL1 and IL2.

Figure 14A:
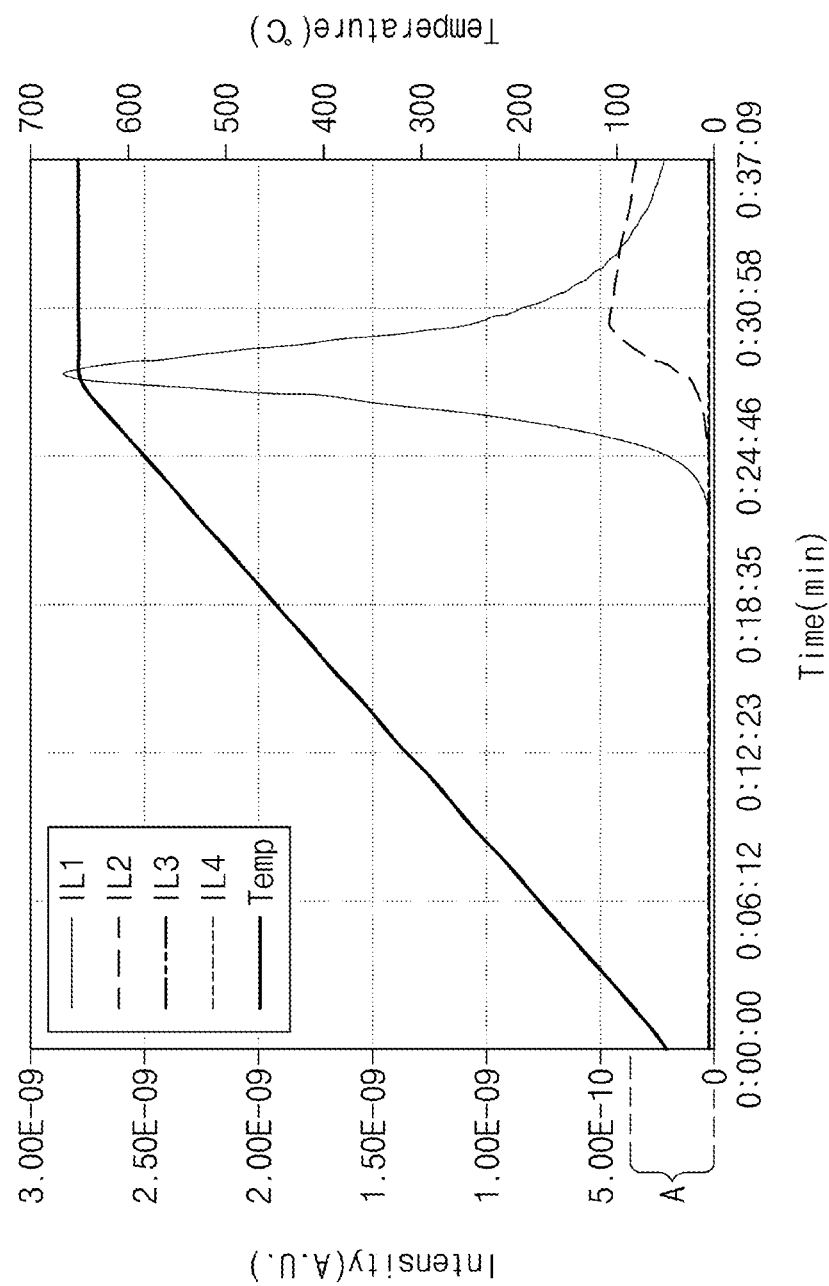
FIG. 14A illustrates a graph showing hydrogen permeability of blocking layers including different materials from each other in a semiconductor device according to some example embodiments.
Figure 14B:
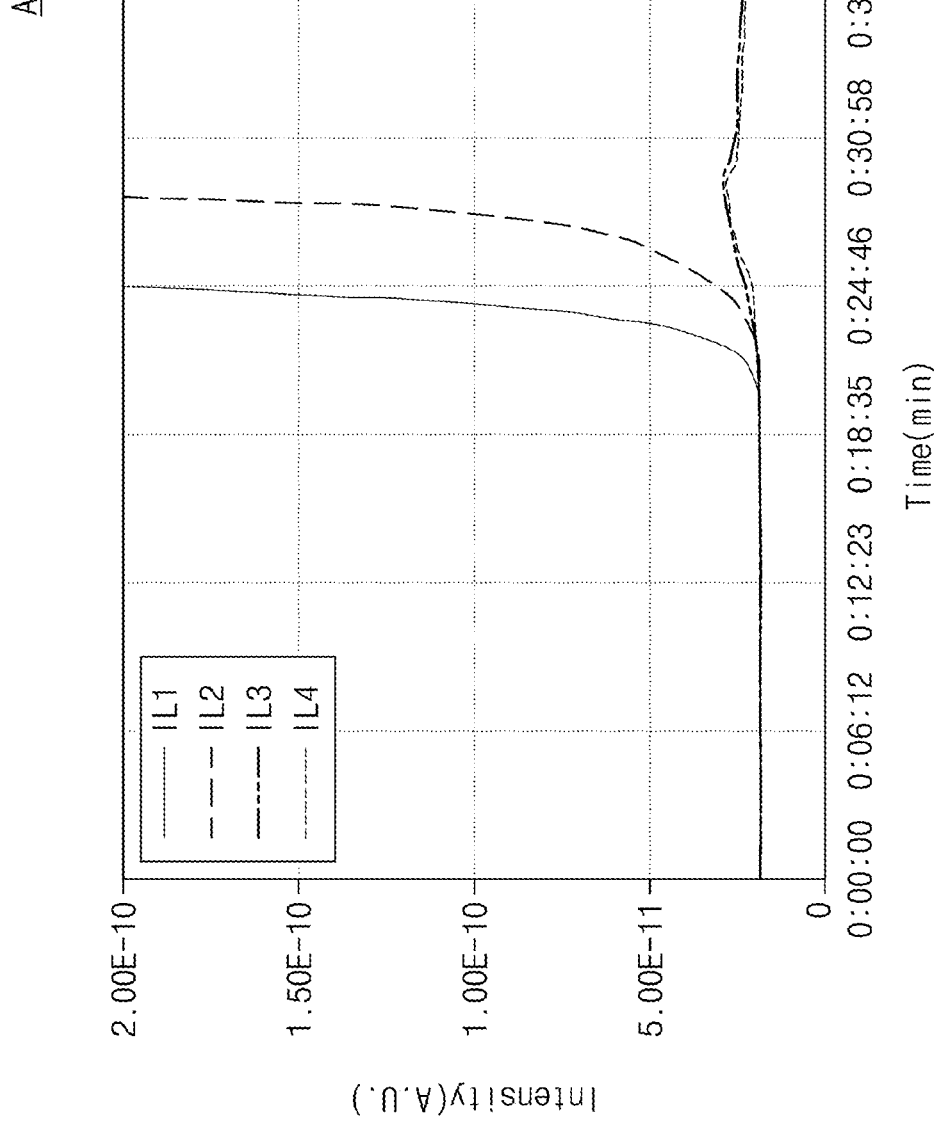
FIG. 14B illustrates an enlarged view showing section A of FIG. 14A.

FIG. 14A illustrates a graph showing hydrogen permeability of blocking layers including different materials from each other in a semiconductor device according to some example embodiments. FIG. 14B illustrates an enlarged view showing section A of FIG. 14A.

Referring to FIGS. 14A and 14B, a method of measuring hydrogen permeability may include forming, on a silicon substrate, an HDP layer whose thickness is about 8,000 Å, forming, on the HDP layer, one of first to fourth dielectric layers IL1 to IL4 that has a thickness of about 200 Å, and detecting hydrogen desorbed from the one of the first to fourth dielectric layers IL1 to IL4 while increasing a temperature. The HDP layer may be a hydrogen source.

As the temperature is increased, hydrogen may be detected from the first to fourth dielectric layers IL1 to IL4 at about 500° C. or higher. An amount of hydrogen detected from the third dielectric layer IL3 or the fourth dielectric layer IL4 may be less than that detected from the first dielectric layer IL1 and that detected from the second dielectric layer IL2. When the first to fourth dielectric layers IL1 to IL4 are compared with each other in terms of an amount of detected hydrogen, it may be seen that the third and fourth dielectric layers IL3 and IL4 have a hydrogen permeability less than those of the first and second dielectric layers IL1 and IL2.

Figure 15A:
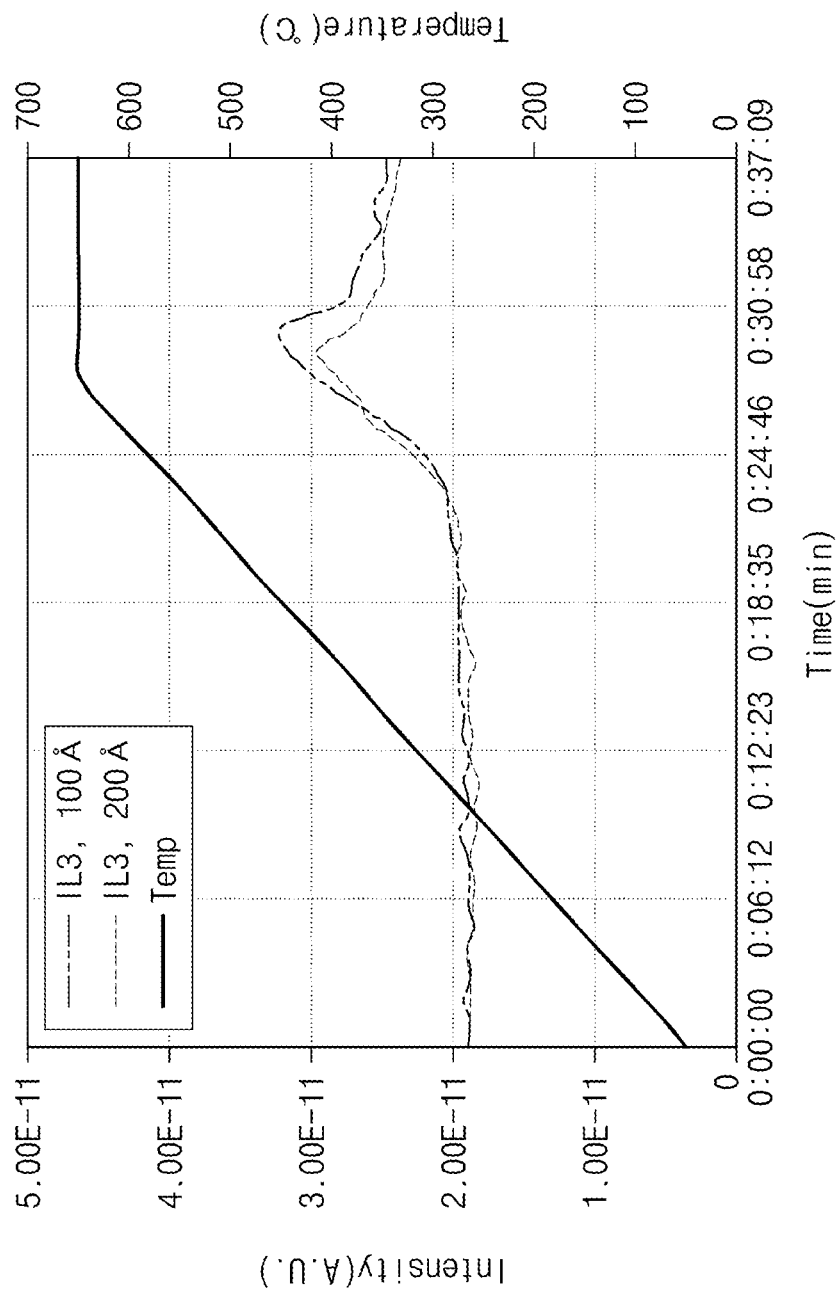
FIGS. 15A and 15B illustrate graphs showing hydrogen permeability of blocking layers with different thicknesses in a semiconductor device according to some example embodiments.
Figure 15B:
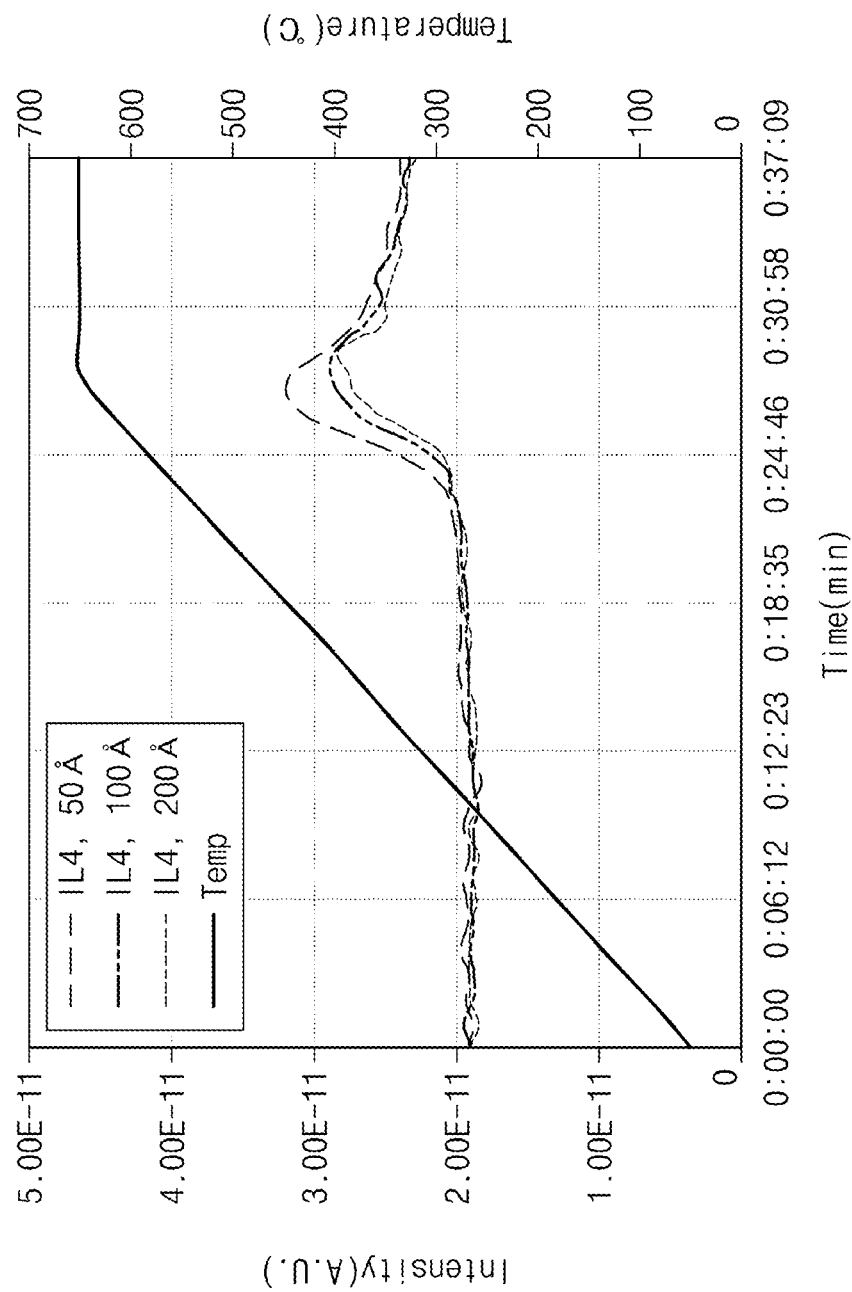

FIGS. 15A and 15B illustrate graphs showing hydrogen permeability of blocking layers with different thicknesses in a semiconductor device according to some example embodiments.

In FIGS. 15A and 15B, a method of measuring hydrogen permeability may be substantially the same as that discussed with reference to FIGS. 14A and 14B. Referring to FIG. 15A, hydrogen may be detected from the third dielectric layer IL3 whose thickness ranges from about 100 Å to about 200 Å. The larger thickness of the third dielectric layer IL3, the smaller amount of detected hydrogen. Referring to FIG. 15B, hydrogen may be detected from the fourth dielectric layer IL4 whose thickness is about 50, 100, or 200 Å. The larger thickness of the fourth dielectric layer IL4, the smaller amount of detected hydrogen.

Referring to FIGS. 2, 13, 14A, 14B, 15A, and 15B, the hydrogen content and the hydrogen permeability may be less in the third and fourth dielectric layers IL3 and IL4, each having a thickness of about 50 Å or higher and each including aluminum oxide (AlOx), than in the first and second dielectric layers IL1 and IL2 each including silicon nitride (SiN). As a result, the third and fourth dielectric layers IL3 and IL4 may be suitable for being used for the blocking layer 175 that blocks a supply path along which hydrogen can migrate to or in the peripheral circuit region PCR.

By way of summation and review, semiconductor devices with high reliability, high speed, and/or multi-functionality have been considered. Semiconductor devices may be gradually complicated and integrated to meet these characteristics.

One or more embodiments may provide a semiconductor device having a structure that selectively blocks introduction of hydrogen into a peripheral circuit region.

One or more embodiments may provide a semiconductor device with increased reliability and improved electrical characteristics.

A semiconductor device according to some example embodiments may be configured such that a hydrogen supply path is maintained through or to reach a cell array region to thereby reduce leakage current and also to help improve electrical characteristics of a cell array, and that the hydrogen supply to a peripheral circuit region is selectively blocked to help prevent a reduction in reliability of peripheral circuits.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    a substrate including a cell array region and a peripheral circuit region;
    a cell transistor on the cell array region of the substrate;
    a peripheral transistor on the peripheral circuit region of the substrate;
    a first interconnection layer connected to the cell transistor;
    a second interconnection layer connected to the peripheral transistor;
    a first interlayer dielectric layer covering the first interconnection layer; and
    a second interlayer dielectric layer spaced apart from the first interconnection layer and covering the second interconnection layer,
    wherein the second interlayer dielectric layer has a hydrogen concentration less than a hydrogen concentration of the first interlayer dielectric layer.

2. The semiconductor device as claimed in claim 1, wherein the second interlayer dielectric layer includes silicon oxide.

3. The semiconductor device as claimed in claim 1, wherein each of the first interconnection layer and the second interconnection layer has a lower width and an upper width on the lower width in a direction that is parallel to a top surface of the substrate, the upper width being less than the lower width.

4. The semiconductor device as claimed in claim 1, further comprising a data storage structure connected to the first interconnection layer.

5. The semiconductor device as claimed in claim 1, further comprising a passivation layer on the first interlayer dielectric layer and the second interlayer dielectric layer.

6. The semiconductor device as claimed in claim 1, wherein a top surface of the second interlayer dielectric layer is coplanar with a top surface of the first interlayer dielectric layer.

7. The semiconductor device as claimed in claim 1, wherein a material of the first interlayer dielectric layer is different from a material of the second interlayer dielectric layer.

8. The semiconductor device as claimed in claim 1, further comprising:
a first antireflective layer on the first interconnection layer; and
a second antireflective layer on the second interconnection layer.

9. The semiconductor device as claimed in claim 8, wherein the second interlayer dielectric layer covers a top surface of the second antireflective layer.

10. A semiconductor device, comprising:
a substrate including a cell array region and a peripheral circuit region;
a cell transistor on the cell array region of the substrate;
a peripheral transistor on the peripheral circuit region of the substrate;
a first interconnection layer connected to the cell transistor;
a second interconnection layer connected to the peripheral transistor;
a first interlayer dielectric layer covering the first interconnection layer; and
a second interlayer dielectric layer spaced apart from the first interconnection layer and covering the second interconnection layer,
wherein a top surface of the first interlayer dielectric layer is coplanar with a top surface of the second interlayer dielectric layer, and
wherein a material of the first interlayer dielectric layer is different from a material of the second interlayer dielectric layer.

11. The semiconductor device as claimed in claim 10, further comprising an interface layer between the substrate and the first interconnection layer and the second interconnection layer.

12. The semiconductor device as claimed in claim 10, further comprising:
a first antireflective layer on the first interconnection layer; and
a second antireflective layer on the second interconnection layer.

13. The semiconductor device as claimed in claim 12, wherein the second interlayer dielectric layer covers a sidewall of the second interconnection layer and a top surface of the second antireflective layer.

14. The semiconductor device as claimed in claim 10, wherein each of the first interconnection layer and the second interconnection layer has a lower width and an upper width on the lower width in a direction that is parallel to a top surface of the substrate, the upper width being less than the lower width.

15. The semiconductor device as claimed in claim 10, wherein the second interlayer dielectric layer includes silicon oxide.

16. A semiconductor device, comprising:
a substrate including a cell array region and a peripheral circuit region;
a plurality of cell transistors on the cell array region of the substrate;
a plurality of capacitors on the plurality of cell transistors, each of the plurality of capacitors connected to a corresponding one of the plurality of cell transistors;
a plurality of peripheral transistors on the peripheral circuit region of the substrate;
a first lower interconnection layer connected to one of the plurality of capacitors;
a second lower interconnection layer connected to one of the plurality of peripheral transistors;
an interface layer covering the first lower interconnection layer and the second lower interconnection layer;
a first upper interconnection layer connected to the first lower interconnection layer;
a second upper interconnection layer connected to the second lower interconnection layer;
a first interlayer dielectric layer covering the first upper interconnection layer;
a second interlayer dielectric layer spaced apart from the first upper interconnection layer and covering the second upper interconnection layer; and
a passivation layer on the first interlayer dielectric layer and the second interlayer dielectric layer,
wherein the semiconductor device includes:
a plurality of first impurity regions and a plurality of second impurity regions in an upper portion of an active section defined by a device isolation layer;
a plurality of bit-line contacts connected to the plurality of first impurity regions; and
a plurality of node contacts connected to the plurality of second impurity regions, and
wherein each of the plurality of capacitors includes a bottom electrode, a top electrode, and a dielectric layer between the bottom electrode and the top electrode.

17. The semiconductor device as claimed in claim 16, wherein the first lower interconnection layer or the second lower interconnection layer includes a barrier layer.

18. The semiconductor device as claimed in claim 16, wherein a material of the first interlayer dielectric layer is different from a material of the second interlayer dielectric layer.

19. The semiconductor device as claimed in claim 16, wherein the second interlayer dielectric layer has a hydrogen concentration less than a hydrogen concentration of the first interlayer dielectric layer.

20. The semiconductor device as claimed in claim 16, wherein a top surface of the second interlayer dielectric layer is coplanar with a top surface of the first interlayer dielectric layer.

* * * * *